United States Patent
Vaisman et al.

(10) Patent No.: US 11,561,030 B1
(45) Date of Patent: Jan. 24, 2023

(54) THERMAL MANAGEMENT SYSTEMS

(71) Applicant: Booz Allen Hamilton Inc., McLean, VA (US)

(72) Inventors: Igor Vaisman, Carmel, IN (US); Joshua Peters, Knoxville, TN (US)

(73) Assignee: Booz Allen Hamilton Inc., McLean, VA (US)

( * ) Notice: Subject to any disclaimer, the term of this patent is extended or adjusted under 35 U.S.C. 154(b) by 0 days.

(21) Appl. No.: 17/191,826

(22) Filed: Mar. 4, 2021

Related U.S. Application Data

(60) Provisional application No. 63/039,060, filed on Jun. 15, 2020.

(51) Int. Cl.
| | |
|---|---|
| *F25B 19/00* | (2006.01) |
| *F25B 1/00* | (2006.01) |
| *F25B 43/04* | (2006.01) |
| *F25B 43/00* | (2006.01) |
| *F25B 31/02* | (2006.01) |

(52) U.S. Cl.
CPC .............. *F25B 19/00* (2013.01); *F25B 1/00* (2013.01); *F25B 31/02* (2013.01); *F25B 43/00* (2013.01); *F25B 43/043* (2013.01)

(58) Field of Classification Search
CPC .. F25B 19/00; F25B 1/00; F25B 31/02; F25B 43/00; F25B 43/043; F25B 5/04; F25J 2270/904
See application file for complete search history.

(56) References Cited

U.S. PATENT DOCUMENTS

| | | | |
|---|---|---|---|
| 1,836,318 | A | 12/1931 | Gay |
| 2,489,514 | A | 11/1949 | Benz |
| 2,526,221 | A | 10/1950 | Goddard |
| 2,785,540 | A | 3/1957 | Biehn |
| 2,852,922 | A | 9/1958 | Neumann et al. |
| 2,885,864 | A | 5/1959 | Benjamin |
| 3,300,996 | A | 1/1967 | Atwood |
| 3,468,421 | A | 9/1969 | Hazel et al. |
| 3,542,338 | A | 11/1970 | Scaramucci |
| 3,600,904 | A | 8/1971 | Tilney |
| 3,685,310 | A | 8/1972 | Fischer |
| 3,789,583 | A | 2/1974 | Smith |
| 3,866,427 | A | 2/1975 | Rothmayer et al. |
| 4,015,439 | A | 4/1977 | Stem |
| 4,016,657 | A | 4/1977 | Passey |

(Continued)

FOREIGN PATENT DOCUMENTS

JP 2010-133606 6/2010

OTHER PUBLICATIONS

U.S. Appl. No. 16/448,196, filed Jun. 21, 2019, Vaisman et al.

(Continued)

*Primary Examiner* — David J Teitelbaum
(74) *Attorney, Agent, or Firm* — Fish & Richardson P.C.

(57) ABSTRACT

Thermal management systems include an open-circuit refrigeration system featuring a receiver configurable to store a refrigerant fluid, an evaporator configurable to extract heat from a heat load when the heat load contacts the evaporator, and an exhaust line, where the receiver, the evaporator, and the exhaust line are connected to form a refrigerant fluid flow path, and a first control device configurable to control a vapor quality of the refrigerant fluid at an outlet of the evaporator along the refrigerant fluid flow path.

35 Claims, 13 Drawing Sheets

(56) References Cited

U.S. PATENT DOCUMENTS

| | | | |
|---|---|---|---|
| 4,054,433 A | 10/1977 | Buffiere et al. | |
| 4,123,919 A | 11/1978 | Fehlhaber | |
| 4,151,724 A | 5/1979 | Garland | |
| 4,169,361 A | 10/1979 | Baldus | |
| 4,275,570 A | 6/1981 | Szymaszek et al. | |
| 4,280,105 A | 7/1981 | Marcy | |
| 4,323,109 A | 4/1982 | Jaster | |
| 4,352,272 A | 10/1982 | Taplay | |
| 4,419,865 A | 12/1983 | Szymaszek | |
| 4,466,253 A | 8/1984 | Jaster | |
| 4,539,816 A | 9/1985 | Fox | |
| 4,870,830 A | 10/1989 | Hohenwarter et al. | |
| 4,969,495 A | 11/1990 | Grant | |
| 5,088,304 A | 2/1992 | Schlichtig | |
| 5,094,277 A | 3/1992 | Grant | |
| 5,099,487 A * | 3/1992 | Rickey | H01S 5/02415 361/689 |
| 5,127,230 A | 7/1992 | Neeser et al. | |
| 5,150,580 A | 9/1992 | Hyde | |
| 5,176,008 A | 1/1993 | Van Steenburgh, Jr. | |
| 5,187,953 A | 2/1993 | Mount | |
| 5,191,776 A | 3/1993 | Severance et al. | |
| 5,245,840 A | 9/1993 | Van Steenburgh, Jr. | |
| 5,297,392 A | 3/1994 | Takata et al. | |
| 5,325,894 A | 7/1994 | Kooy et al. | |
| 5,335,508 A * | 8/1994 | Tippmann | F25B 7/00 62/305 |
| 5,353,603 A | 10/1994 | Outlaw et al. | |
| 5,360,139 A | 11/1994 | Goode | |
| 5,471,848 A | 12/1995 | Major et al. | |
| 5,513,961 A | 5/1996 | Engdahl et al. | |
| 5,647,221 A * | 7/1997 | Garris, Jr. | F04F 5/462 417/179 |
| 5,690,743 A | 11/1997 | Murakami et al. | |
| 5,762,119 A | 6/1998 | Platz et al. | |
| 5,974,812 A | 11/1999 | Kátai et al. | |
| 6,044,647 A | 4/2000 | Drube et al. | |
| 6,076,360 A | 6/2000 | Viegas et al. | |
| 6,112,532 A | 9/2000 | Bakken | |
| 6,230,518 B1 | 5/2001 | Hahn et al. | |
| 6,314,749 B1 | 11/2001 | Van Steenburgh, Jr. | |
| 6,331,281 B1 | 12/2001 | Teru et al. | |
| 6,354,088 B1 | 3/2002 | Emmer et al. | |
| 6,381,972 B1 | 5/2002 | Cotter | |
| 6,474,101 B1 | 11/2002 | Quine et al. | |
| 6,564,578 B1 | 5/2003 | Fischer-Calderon | |
| 6,964,168 B1 | 11/2005 | Pierson et al. | |
| 7,377,126 B2 | 5/2008 | Gorbounov et al. | |
| 7,497,180 B2 | 3/2009 | Karlsson et al. | |
| 7,891,197 B2 | 2/2011 | Winter | |
| 7,987,685 B2 | 8/2011 | Oshitani et al. | |
| 9,267,645 B2 | 2/2016 | Mackey | |
| 9,791,221 B1 | 10/2017 | Litch | |
| 10,126,022 B1 | 11/2018 | Cooper | |
| 10,612,821 B1 | 4/2020 | Fernando | |
| 10,746,440 B2 | 8/2020 | Donovan et al. | |
| 10,907,869 B2 | 2/2021 | Hagh et al. | |
| 11,112,155 B1 | 9/2021 | Vaisman et al. | |
| 11,168,925 B1 | 11/2021 | Vaisman et al. | |
| 11,231,209 B2 | 1/2022 | Cavalleri et al. | |
| 2002/0148225 A1 | 10/2002 | Lewis | |
| 2002/0157407 A1 | 10/2002 | Weng | |
| 2002/0157821 A1* | 10/2002 | Beitelmal | H05K 7/20381 165/206 |
| 2004/0123624 A1 | 7/2004 | Ohta et al. | |
| 2005/0060970 A1 | 3/2005 | Polderman | |
| 2005/0201429 A1 | 9/2005 | Rice et al. | |
| 2005/0279491 A1* | 12/2005 | Thome | F28D 15/06 165/96 |
| 2006/0207285 A1 | 9/2006 | Oshitani et al. | |
| 2006/0218964 A1 | 10/2006 | Saito et al. | |
| 2007/0007879 A1 | 1/2007 | Bergman, Jr. et al. | |
| 2007/0051114 A1 | 3/2007 | Mahlanen | |
| 2007/0180852 A1 | 8/2007 | Sugiura et al. | |
| 2008/0092559 A1 | 4/2008 | Williams et al. | |
| 2008/0148754 A1 | 6/2008 | Snytsar | |
| 2008/0196446 A1 | 8/2008 | Nakamura et al. | |
| 2009/0158727 A1 | 6/2009 | Bitter et al. | |
| 2009/0211298 A1 | 8/2009 | Saul | |
| 2009/0219960 A1 | 9/2009 | Uberna et al. | |
| 2009/0228152 A1 | 9/2009 | Anderson et al. | |
| 2010/0098525 A1 | 4/2010 | Guelich | |
| 2010/0154395 A1 | 6/2010 | Frick | |
| 2011/0114284 A1 | 5/2011 | Siegenthaler | |
| 2012/0167601 A1 | 7/2012 | Cogswell et al. | |
| 2012/0204583 A1 | 8/2012 | Liu | |
| 2012/0312379 A1 | 12/2012 | Gielda et al. | |
| 2013/0000341 A1 | 1/2013 | De Piero et al. | |
| 2013/0025305 A1 | 1/2013 | Higashiiue et al. | |
| 2013/0104593 A1 | 5/2013 | Occhipinti | |
| 2013/0111934 A1 | 5/2013 | Wang et al. | |
| 2013/0125569 A1 | 5/2013 | Verma et al. | |
| 2013/0251505 A1 | 9/2013 | Wang et al. | |
| 2013/0340622 A1 | 12/2013 | Marty et al. | |
| 2014/0075984 A1 | 3/2014 | Sugawara et al. | |
| 2014/0165633 A1 | 6/2014 | De Piero et al. | |
| 2014/0166238 A1 | 6/2014 | Sandu | |
| 2014/0260341 A1 | 9/2014 | Vaisman et al. | |
| 2014/0331699 A1 | 11/2014 | Higashiiue | |
| 2014/0345318 A1 | 11/2014 | Nagano et al. | |
| 2014/0366563 A1 | 12/2014 | Vaisman et al. | |
| 2015/0059379 A1 | 3/2015 | Ootani et al. | |
| 2015/0260435 A1 | 9/2015 | Kawano et al. | |
| 2015/0263477 A1 | 9/2015 | Onaka | |
| 2015/0362230 A1 | 12/2015 | Al-Farayedhi et al. | |
| 2016/0010907 A1 | 1/2016 | Ali | |
| 2016/0114260 A1 | 4/2016 | Frick | |
| 2016/0201956 A1 | 7/2016 | Tamura et al. | |
| 2016/0216029 A1 | 7/2016 | Ragot | |
| 2016/0291137 A1 | 10/2016 | Sakimura et al. | |
| 2016/0333747 A1 | 11/2016 | KanFman | |
| 2017/0081982 A1 | 3/2017 | Kollmeier et al. | |
| 2017/0108263 A1 | 4/2017 | Cermak et al. | |
| 2017/0167767 A1 | 6/2017 | Shi et al. | |
| 2017/0205120 A1 | 7/2017 | Ali et al. | |
| 2017/0299229 A1 | 10/2017 | Carter et al. | |
| 2018/0023805 A1 | 1/2018 | Qin et al. | |
| 2018/0180307 A1 | 6/2018 | Owejan et al. | |
| 2018/0245740 A1 | 8/2018 | Kaminsky et al. | |
| 2018/0245835 A1 | 8/2018 | Kamei et al. | |
| 2018/0328638 A1 | 11/2018 | Mahmoud et al. | |
| 2019/0072035 A1 | 3/2019 | Peace et al. | |
| 2019/0111764 A1 | 4/2019 | Oshitani et al. | |
| 2019/0170425 A1 | 6/2019 | Takami et al. | |
| 2019/0203988 A1 | 7/2019 | Kobayashi et al. | |
| 2019/0248450 A1 | 8/2019 | Lee et al. | |
| 2019/0293302 A1 | 9/2019 | Van et al. | |
| 2019/0393525 A1 | 12/2019 | Diethelm et al. | |
| 2020/0018554 A1* | 1/2020 | Ipposhi | F25B 23/006 |
| 2020/0158386 A1 | 5/2020 | Wu et al. | |
| 2020/0239109 A1 | 7/2020 | Lee et al. | |
| 2020/0363101 A1* | 11/2020 | Jansen | F25B 40/02 |
| 2021/0095901 A1 | 4/2021 | Perez-Blanco | |
| 2021/0135421 A1 | 5/2021 | Davis | |

OTHER PUBLICATIONS

U.S. Appl. No. 16/448,271, filed Jun. 21, 2019, Vaisman et al.
U.S. Appl. No. 16/448,283, filed Jun. 21, 2019, Vaisman et al.
U.S. Appl. No. 16/448,332, filed Jun. 21, 2019, Vaisman et al.
U.S. Appl. No. 16/448,388, filed Jun. 21, 2019, Vaisman et al.
U.S. Appl. No. 16/666,851, filed Oct. 29, 2019, Davis et al.
U.S. Appl. No. 16/666,859, filed Oct. 29, 2019, Davis et al.
U.S. Appl. No. 16/666,865, filed Oct. 29, 2019, Davis et al.
U.S. Appl. No. 16/666,881, filed Oct. 29, 2019, Davis et al.
U.S. Appl. No. 16/666,899, filed Oct. 29, 2019, Davis et al.
U.S. Appl. No. 16/666,940, filed Oct. 29, 2019, Vaisman et al.
U.S. Appl. No. 16/666,950, filed Oct. 29, 2019, Vaisman et al.
U.S. Appl. No. 16/666,954, filed Oct. 29, 2019, Vaisman et al.
U.S. Appl. No. 16/666,959, filed Oct. 29, 2019, Vaisman et al.
U.S. Appl. No. 16/666,962, filed Oct. 29, 2019, Vaisman et al.

(56) References Cited

OTHER PUBLICATIONS

U.S. Appl. No. 16/666,966, filed Oct. 29, 2019, Vaisman et al.
U.S. Appl. No. 16/666,973, filed Oct. 29, 2019, Vaisman et al.
U.S. Appl. No. 16/666,977, filed Oct. 29, 2019, Vaisman et al.
U.S. Appl. No. 16/666,986, filed Oct. 29, 2019, Vaisman et al.
U.S. Appl. No. 16/666,992, filed Oct. 29, 2019, Vaisman et al.
U.S. Appl. No. 16/666,995, filed Oct. 29, 2019, Vaisman et al.
U.S. Appl. No. 16/684,775, filed Nov. 15, 2019, Peters et al.
U.S. Appl. No. 16/807,340, filed Mar. 3, 2020, Vaisman et al.
U.S. Appl. No. 16/807,353, filed Mar. 3, 2020, Vaisman et al.
U.S. Appl. No. 16/807,411, filed Mar. 3, 2020, Vaisman et al.
U.S. Appl. No. 16/807,413, filed Mar. 3, 2020, Vaisman et al.
U.S. Appl. No. 16/807,582, filed Mar. 3, 2020, Vaisman et al.
U.S. Appl. No. 16/872,584, filed May 12, 2020, Vaisman et al.
U.S. Appl. No. 16/872,590, filed May 12, 2020, Vaisman et al.
U.S. Appl. No. 16/872,592, filed May 12, 2020, Vaisman et al.
U.S. Appl. No. 17/020,913, filed Sep. 15, 2020, May 6, 2021, Davis.
U.S. Appl. No. 17/114,702, filed Dec. 8, 2020, Vaisman et al.
U.S. Appl. No. 17/114,728, filed Dec. 8, 2020, Vaisman et al.
U.S. Appl. No. 17/114,748, filed Dec. 8, 2020, Vaisman et al.
U.S. Appl. No. 17/114,766, filed Dec. 8, 2020, Vaisman et al.
U.S. Appl. No. 17/114,785, filed Dec. 8, 2020, Vaisman et al.
U.S. Appl. No. 17/178,378, filed Feb. 18, 2021, Vaisman et al.
U.S. Appl. No. 17/178,380, filed Feb. 18, 2021, Vaisman et al.
U.S. Appl. No. 17/178,390, filed Feb. 18, 2021, Vaisman et al.
U.S. Appl. No. 17/189,407, filed Mar. 2, 2021, Vaisman et al.
U.S. Appl. No. 17/189,410, filed Mar. 2, 2021, Vaisman et al.
U.S. Appl. No. 17/189,422, filed Mar. 2, 2021, Vaisman et al.
U.S. Appl. No. 17/189,430, filed Mar. 2, 2021, Vaisman et al.
U.S. Appl. No. 17/191,788, filed Mar. 4, 2021, Vaisman et al.
U.S. Appl. No. 17/191,797, filed Mar. 4, 2021, Vaisman et al.
U.S. Appl. No. 17/231,084, filed Apr. 15, 2021, Vaisman et al.
U.S. Appl. No. 17/231,092, filed Apr. 15, 2021, Vaisman et al.
U.S. Appl. No. 17/394,551, filed Aug. 5, 2021, Vaisman et al.
[No. Author Listed], "Thermostatic Expansion Valves" Theory of Operation, Application, and Selection, Bulletin 10-9, Sporlan, Mar. 2011, 19 pages.
ammonia21.com [online], "R717 vs r404a do the advantages outweigh the disadvantages," Nov. 30, 2012, retrieved from <http://www.annnnonia21.conn/articles/3717/>, 13 pages.
Elstroem, "Capacitive Sensors Measuring the Vapor Quality, Phase of the refrigerant and Ice thickness for Optimized evaporator performance," Proceedings of the 13th HR Gustav Lorentzen Conference on Natural Refrigerants (GL:2018), Valencia, Spain, Jun. 18-20, 2018, 10 pages.
Elstroem, "New Refrigerant Quality Measurement and Demand Defrost Methods," 2017 IIAR Natural Refrigeration Conference & Heavy Equipment Expo, San Antonio, TX, Technical Paper #1, 38 pages.
en.wikipedia.org [online] "Inert gas—Wikipedia" retrieved on Oct. 1, 2021, retrieved from URL < https://en.wikipedia.org/w/index.php?title=lnert_gas&oldid=1047231716>, 4 pages.

en.wikipedia.org [online] "Pressure regulator—Wikipedia," retrieved on Oct. 7, 2021, retrieved from URL < https://en.wikipedia.org/wiki/Pressure_regulator>, 8 pages.
en.wikipedia.org [online], "Isenthalpic process—Wikipedia, the free encyclopedia," available on or before Mar. 29, 2015, via Internet Archive: Wayback Machine URL <https://web.archive.org/web/20150329105343/https://en.wikipedia.org/wiki/Isenthalpicprocess>, retrieved on Jan. 12, 2021, retrieved from URL <https://en.wikipedia.org/wiki/Isenthalpicprocess>, 2 pages.
en.wikipedia.org [online], "Thermal expansion valve—Wikipedia", Dec. 23, 2020, retrieved on Jan. 8, 2021, retrieved from URL <https://en.wikipedia.org/wiki/Themnal expansion valve>, 4 pages.
en.wikipedia.org [online], "Thermal expansion valve—Wikipedia," available on or before Febmary 14, 2015, via Internet Archive: Wayback Machine URL <https://web.archive.org/web/20150214054154/https://en.wikipedia.org.wiki/Thermal_expansion_valve>, retrieved on Jan. 12, 2021, URL <https://en.wikipedia.org.wiki/Thermal_expansion_valve>, 3 pages.
engineersedge.com [online], "Throttling Process Thermodynamic," Apr. 16, 2015, via Internet Archive: Wayback Machine URL <https://web.archive.org/web/20150416181050/https://www.engineersedge.conn/thernnodynannics/throttling process.htm>, retrieved on Jan. 12, 2021, retrieved from URL <https://en.wikipedia.org/wiki/Isenthalpicprocess>, 1 pages.
fommautomation.com [online], "What is an expansion valve and what are its types," Jun. 14, 2020, retrieved on Jan. 10, 2022, retrieved from URLhttps://forumautomation.com/t/what-is-an-expansion-valve-and-what-are-its-types/8385, 5 pages.
International Search Report and Written Opinion in International Appln. No. PCT/US2020/056787, dated Jan. 27, 2021, 13 pages.
NASA History Office, "Quest for Performance: The Evolution of Modern Aircraft, Part II: The Jet Age, Chapter 10: Technology of the Jet Airplane, Turbojet and Turbofan Systems," NASA Scientific and Technical Information Branch, originally published in 1985, last updated Aug. 6, 2004, 21 pages.
Ohio.edu [online], "20 Engineering Thermodynamics Israel Urieli", Sep. 9, 2009, retrieved from URL<https://www.ohio.edu/mechanical/thermo/Intro/Chapt.1_6/Chapter2a.html>, 1 page.
osha.gov, [online] "Storage and handling of anhydrous ammonia," Part No. 1910, Standard No. 1910.111, GPO Source: e-CFR, 2005, retrieved on Oct. 2, 2021, retrieved from URL < https://www.osha.gov/laws-regs/regulations/standardnumber/1910/1910.111>, 31 pages.
thermal-engineering.org [online] "What is Vapor Quality—Dryness Fraction—Definition," May 22, 2019, retrieved on Oct. 19, 2021, retrieved from URL < https://www.thermal-engineering.org/what-is-vapor-quality-dryness-fraction-definition/>, 6 pages.
Wojtan et al., "Investigation of flow boiling in horizontal tubes: Part I—A new diabatic two-phase flow pattern map. International journal of heat and mass transfer," Jul. 2005, 48(14):2955-69.
Wojtan et al., "Investigation of flow boiling in horizontal tubes: Part II—Development of a new heat transfer model for stratified-wavy, dryout and mist flow regimes," International journal of heat and mass transfer, Jul. 2005, 48(14):2970-85.
Nagano et al., "Ejector Type Refrigerating Cycle" Jun. 17, 2010, 37 pages (full English translation of JP2010133606A).

* cited by examiner

THERMAL MANAGEMENT SYSTEMS

CLAIM OF PRIORITY

This application claims priority under 35 USC § 119(e) to U.S. Provisional Patent Application Ser. No. 63/039,060, filed on Jun. 15, 2020, and entitled "THERMAL MANAGEMENT SYSTEMS," the entire contents of which are hereby incorporated by reference.

BACKGROUND

This disclosure relates to refrigeration systems.

Refrigeration systems absorb thermal energy from heat sources operating at temperatures above the temperature of the surrounding environment, and discharge thermal energy into the surrounding environment. Conventional refrigeration systems can include at least a compressor, a heat rejection exchanger (i.e., a condenser), a liquid refrigerant receiver, an expansion device, and a heat absorption exchanger (i.e., an evaporator). Such systems can be used to maintain operating temperature set points for a wide variety of cooled heat sources (loads, processes, equipment, systems) thermally interacting with the evaporator.

While closed-circuit refrigeration systems may pump significant amounts of absorbed thermal energy from heat sources into the surrounding environment, such systems may not be adequate for specific applications. Consider that condensers and compressors are generally heavy and consume relatively large amounts of power for a given amount of heat removal capacity. In general, the larger the amount of absorbed thermal energy that the system is designed to handle, the heavier the refrigeration system and the larger the amount of power consumed during operation, even when cooling of a heat source occurs over relatively short time periods.

SUMMARY

According to an aspect a thermal management system includes an open-circuit refrigeration system including a liquid separator configurable to store a refrigerant, the liquid separator having an inlet, a vapor-side outlet and a liquid-side outlet, a pump having a pump inlet and a pump outlet, with the pump inlet receiving refrigerant from the liquid-side outlet and configurable to pump the liquid refrigerant received from the liquid-side outlet, a first evaporator having an evaporator inlet and an evaporator outlet and configurable to extract heat from a heat first load in proximity to the first evaporator, a second evaporator having an evaporator inlet and an evaporator outlet and configurable to extract heat from a second heat load in proximity to the evaporator, an exhaust line, and a control device configurable to control a temperature of the heat load, with the liquid separator, the first evaporator, the second evaporator, the control device, and the exhaust line coupled to form an open-circuit refrigerant flow path.

The above aspect may include amongst features described herein one or more of the following features.

The open-circuit refrigerant flow path consists essentially of the control device, the exhaust line, at least the first evaporator and the liquid separator.

The pump is configurable to receive liquid refrigerant from the liquid separator at a single pressure and direct the refrigerant mixture into the first evaporator at the single pressure.

The control device is a back-pressure regulator.

The control device is configurable to receive refrigerant vapor generated in the first evaporator, and configurable to regulate a pressure of the refrigerant upstream of the control device along the open-circuit refrigerant flow path.

The refrigerant from the exhaust line is discharged so that the discharged refrigerant is not returned to the liquid separator.

The system further includes a refrigerant processing apparatus coupled to the exhaust line and configurable to receive discharged refrigerant from the evaporator.

The refrigerant processing apparatus comprises at least one of: a chemical scrubber configurable to convert the refrigerant into one or more products that are chemically different from the refrigerant fluid, an adsorbent material configurable to adsorb particles of the refrigerant fluid, and an incinerator configurable to incinerate the refrigerant. The heat load comprises one or more diodes of a directed energy system.

The first evaporator inlet is coupled to the second evaporator, the first evaporator outlet is coupled to the inlet of the liquid separator, and the second evaporator inlet is coupled to the pump outlet.

The first and second evaporators are integrated into a single evaporator that has a first refrigerant path and a second refrigerant path. The first refrigerant path has an inlet coupled to the outlet of the pump and having an outlet of the first refrigerant path coupled to an inlet of the second refrigerant path, and with an outlet of the second refrigerant path coupled to the inlet of the liquid separator.

The first evaporator inlet is coupled to the pump outlet and the first evaporator outlet is coupled to the inlet of the liquid separator, and with the second evaporator inlet coupled to the liquid-side outlet of the liquid separator and the second evaporator outlet coupled to a second exhaust line. The system further includes a second control device coupled between the liquid-side outlet and the second evaporator inlet. The second control device expands liquid refrigerant from the liquid-side outlet, which is received at the second evaporator inlet. The second control device is an expansion valve and the second evaporator operates at a superheat. The system further includes a sensor disposed at the second evaporator outlet to measure a thermodynamic property of the refrigerant at the second evaporator outlet and to generate a control signal to directly or indirectly control operation of the second control device. The signal controls operation of the second control device to control superheat at the second evaporator outlet.

The refrigerant comprises ammonia.

According to an additional aspect, a thermal management method includes pumping a refrigerant liquid from a liquid separator to a first evaporator that is configurable to extract heat from a heat load in proximity to the first evaporator, transporting the pumped refrigerant through a second evaporator that is configured to extract heat from a second heat load in proximity to the second evaporator, separating by operation of the liquid separator, the refrigerant at an outlet of the first evaporator into refrigerant vapor and refrigerant liquid, and discharging the refrigerant vapor through a control device to an exhaust line so that the discharged refrigerant vapor stream is not returned to the liquid separator.

The above aspect may include amongst features described herein one or more of the following features.

The method further includes receiving liquid refrigerant from the liquid separator at a single pressure, and transporting the refrigerant liquid into the first evaporator at the single pressure. The control device is a back-pressure regulator.

The method further includes receiving by a refrigerant processing apparatus coupled to the exhaust line the discharged refrigerant. The refrigerant processing apparatus comprises at least one of: a chemical scrubber configurable to convert the refrigerant into one or more products that are chemically different from the refrigerant fluid, an adsorbent material configurable to adsorb particles of the refrigerant fluid, and an incinerator configurable to incinerate the refrigerant. The first heat load comprises one or more diodes of a directed energy system.

The first evaporator has an inlet coupled to an outlet of the second evaporator, with the first evaporator further having an outlet coupled to inlet of the liquid separator and the inlet of the second evaporator is coupled to the outlet of the pump, and transporting the pumped refrigerant through the second evaporator includes transporting refrigerant from the outlet of the first evaporator to the inlet of the second evaporator, with the outlet of the second evaporator feeding the refrigerant to the inlet of the liquid separator. The first and second evaporators are integrated into a single evaporator that has a first refrigerant path and a second refrigerant path.

Transporting further includes transporting the refrigerant through the first refrigerant path to the inlet of the liquid separator, and from the liquid side outlet through the second refrigerant path back to the inlet of the first refrigerant path.

The first evaporator has the inlet coupled to the outlet of the pump and the outlet coupled to inlet of the liquid separator and with the second evaporator having the inlet coupled to the outlet of the liquid separator and the outlet coupled to a second exhaust line. The method further includes transporting a portion of the refrigerant liquid from the liquid side outlet through a second control device coupled between the liquid-side outlet and the inlet of the second evaporator. The second evaporator operates at a superheat, and the method further includes measuring with a sensor disposed at the outlet of the second evaporator a thermodynamic property of the refrigerant at the outlet of the second evaporator, and generating a control signal to directly or indirectly control operation of the second control device.

The refrigerant comprises ammonia.

One or more of the above aspects may provide one or more of the following advantages.

Some open-circuit refrigeration systems (OCRS) operate at two pressure levels, i.e., a source of liquid refrigerant is maintained at a high (supply) pressure level and the evaporation process is executed at a comparatively lower evaporating pressure. The disclosed OCRS operates at one pressure level, i.e., the evaporating pressure level.

Some advantages of operating at the evaporating pressure level include reducing the impact of refrigerant distribution, by only requiring one control device, e.g., a back-pressure regulator. The liquid separator serves a liquid refrigerant storage, density of saturated liquid at evaporating temperature is larger than the density of pressurized subcooled liquid, therefore, the storage volume is smaller.

DETAILED DESCRIPTION

I. Introduction

Cooling of high heat flux loads that are also highly temperature sensitive can present a number of challenges. On one hand, such loads generate significant quantities of heat that is extracted during cooling. In conventional closed-cycle refrigeration systems, cooling high heat flux loads typically involves circulating refrigerant fluid at a relatively high mass flow rate. However, closed-cycle system components that are used for refrigerant fluid circulation, including compressors and condensers, are typically heavy and consume significant power. As a result, many closed-cycle systems are not well suited for deployment in mobile platforms, such as on small vehicles, where size and weight constraints may make the use of large compressors and condensers impractical.

On the other hand, temperature sensitive loads such as electronic components and devices may require temperature regulation within a relatively narrow range of operating temperatures. Maintaining the temperature of such a load to within a small tolerance of a temperature set point can be challenging when a single-phase refrigerant fluid is used for heat extraction, since the refrigerant fluid itself will increase in temperature as heat is absorbed from the load.

Directed energy systems that are mounted to mobile vehicles such as trucks may present many of the foregoing operating challenges, as such systems may include high heat flux, temperature sensitive components that require precise cooling during operation in a relatively short time. The TMS disclosed herein, while generally applicable to the cooling of a wide variety of thermal loads, are particularly well suited for operation with such directed energy systems.

In particular, the TMS and methods disclosed herein include a number of features that reduce both overall size and weight relative to conventional refrigeration systems, and still extract excess heat energy from both high heat flux, highly temperature sensitive components and relatively temperature insensitive components, to accurately match temperature set points for the components. At the same time, the disclosed TMS's require no significant power to sustain their operation. Whereas certain conventional refrigeration systems used closed-circuit refrigerant flow paths, the systems and methods disclosed herein use open-cycle refrigerant flow paths. Depending upon the nature of the refrigerant fluid, exhaust refrigerant fluid may be incinerated as fuel, chemically treated, and/or simply discharged at the end of the flow path.

II. Thermal Management Systems with Open-Circuit Refrigeration Systems

Figure 1:
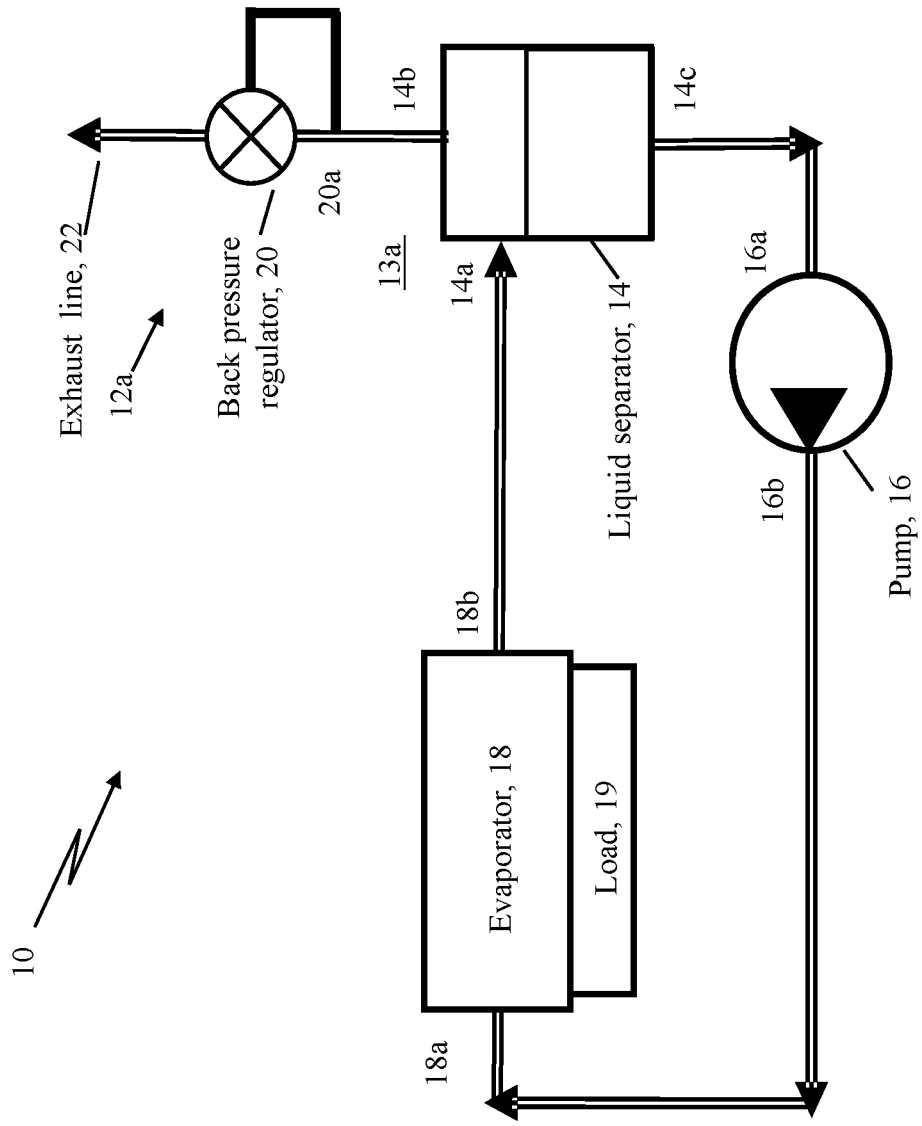
FIG. 1 is a schematic diagram of a thermal management system (TMS) that includes an open-circuit refrigeration system (OCRS) that operates at a single pressure level.

Referring now to FIG. 1, a thermal management system 10 (TMS 10) includes an open-circuit refrigeration system (OCRS) 12a. OCRS 12a includes a liquid separator 14 having an inlet 14a, a vapor-side outlet 14b, and liquid-side outlet 14c. The liquid-side outlet 14c of the liquid separator 14 is coupled to an inlet 16a of a pump 16. An outlet 16b of the pump 16 is coupled to an inlet 18a of an evaporator 18. An outlet 18b of the evaporator 18 is coupled to the inlet 14a of the liquid separator 14. A control device such as a back-pressure regulator 20 is coupled to the vapor-side outlet 14b of the liquid separator 14. The foregoing are coupled via conduits (not referenced) and are arranged in an open-circuit refrigerant fluid flow path 13a extending from the liquid-side outlet 14c through the pump 16, the evaporator 18, the liquid separator 14, the back pressure regulator 20 and to the exhaust line 22. A heat load 19 is thermally coupled to the evaporator 18.

OCRS 12a stores liquid refrigerant in the liquid separator 14. The liquid refrigerant is pumped into the evaporator inlet 18a and in the evaporator 18 evaporation occurs at a certain (evaporating) pressure and temperature. The heat load 19 demand on the evaporator 18 and the pumped mass flow rate define vapor quality at the evaporator outlet 18b. Vapor or a liquid/vapor mixture at the evaporator outlet 18b is fed into the liquid separator 14 that separates the liquid from the vapor, and discharges vapor via an exhaust line 22 that is coupled to the back-pressure regulator 20. The back-pressure regulator 20 is closed when the OCRS is OFF and is ON in modulating mode when the OCRS is ON. In some implementations, the OCRS 12a consists essentially of the foregoing components/devices.

In general, a wide range of different mechanical and electrical/electronic devices can be used as back-pressure regulator 20. Typically, mechanical back-pressure regulating devices have an orifice and a spring supporting the moving seat against the pressure of the refrigerant fluid stream. The moving seat adjusts the cross-sectional area of the orifice and the refrigerant fluid volume and mass flow rates.

Typical electrical back-pressure regulating devices include an orifice, a moving seat, a motor or actuator that changes the position of the seat in respect to the orifice, a controller 17 (see FIG. 10), and a pressure sensor at the evaporator exit or at the valve inlet. If the refrigerant fluid pressure is above a set-point value, the seat moves to increase the cross-sectional area of the orifice and the refrigerant fluid volume and mass flow rates to re-establish the set-point pressure value. If the refrigerant fluid pressure is below the set-point value, the seat moves to decrease the cross-sectional area and the refrigerant fluid flow rates.

In general, back-pressure regulators are selected based on the refrigerant fluid volume flow rate, the pressure differential across the regulator, and the pressure and temperature at the regulator inlet. Examples of suitable commercially available back-pressure regulators that can function as back-pressure regulator 20 include, but are not limited to, valves available from the Sporlan Division of Parker Hannifin Corporation (Washington, Mo.) and from Danfoss (Syddanmark, Denmark).

A variety of different refrigerant fluids can be used in OCRS 12a. For open-circuit refrigeration systems, in general, emissions regulations and operating environments may limit the types of refrigerant fluids that can be used. For example, in certain embodiments, the refrigerant fluid can be ammonia having very large latent heat, after passing through the cooling circuit, the ammonia refrigerant can be disposed of by incineration, by chemical treatment (i.e., neutralization), and/or by direct venting to the atmosphere.

In certain embodiments, the refrigerant fluid can be an ammonia-based mixture that includes ammonia and one or more other substances. For example, mixtures can include one or more additives that facilitate ammonia absorption or ammonia burning.

More generally, any fluid can be used as a refrigerant in the open-circuit refrigeration systems disclosed herein, provided that the fluid is suitable for cooling heat load 19 (e.g., the fluid boils at an appropriate temperature) and, in embodiments where the refrigerant fluid is exhausted directly to the environment, regulations and other safety and operating considerations do not inhibit such discharge.

During operation of OCRS 12a, cooling can be initiated by a variety of different mechanisms. In some embodiments, for example, OCRS 12a includes a temperature sensor attached to load 19 (as will be discussed subsequently). When the temperature of load 19 exceeds a certain temperature set point (i.e., threshold value), the controller 17 (see FIG. 10) connected to the temperature sensor can initiate cooling of load 19.

Alternatively, in certain embodiments, OCRS 12a operates essentially continuously—provided that the refrigerant fluid pressure within liquid separator is sufficient—to cool load 19. As soon as the liquid separator 14 is charged with refrigerant fluid, refrigerant fluid is ready to be directed into evaporator 18 to cool heat load 19. In general, cooling is initiated when a user of the system or the heat load 19 issues a cooling demand.

Upon initiation of a cooling operation, refrigerant fluid, i.e., refrigerant liquid, from the liquid-side outlet 14c is discharged, and is transported through conduit to the inlet 16a of the pump 16. Pump 16 pumps the refrigerant liquid out of pump outlet 16b to evaporator inlet 18a. Inside evaporator 18 a heat exchange occurs in which heat is transferred from the heat load 19 to the refrigerant liquid causing a portion of the refrigerant liquid to change to refrigerant vapor at a vapor quality at the evaporator outlet 18b.

Once inside the evaporator 18, the refrigerant fluid undergoes constant enthalpy expansion from an initial pressure $p_r$ (i.e., the inlet pressure) to an evaporation pressure pc, and is maintained at that pressure during open-circuit operation. In general, the evaporation pressure pc depends on a variety of factors, most notably the desired temperature set point value (i.e., the target temperature) at which the heat load 19 is to be maintained and the heat input generated by the heat load 19.

When the refrigerant liquid is directed into evaporator 18, the liquid phase absorbs heat from load 19, driving a phase transition of the liquid refrigerant fluid into the vapor phase. Because this phase transition occurs at (nominally) constant temperature, the temperature of the refrigerant fluid mixture within evaporator 18 remains unchanged, provided at least some liquid refrigerant fluid remains in evaporator 18 to absorb heat.

Further, the constant temperature of the refrigerant fluid mixture within evaporator 18 can be controlled by adjusting the pump 16 speed and, as a consequence, the pressure pc of the refrigerant liquid, since adjustment of pc changes the boiling temperature of the refrigerant fluid. In addition, one can regulate the refrigerant fluid pressure pc upstream from evaporator 18 (e.g., using back-pressure regulator 20), the temperature of the refrigerant fluid within evaporator 18 (and, nominally, the temperature of heat load 19) can be controlled to match a specific temperature set-point value for load 19, ensuring that heat load 19 is maintained at, or very near, a target temperature.

In some embodiments, for example, the evaporation pressure of the refrigerant fluid can be adjusted by the pump 16 and the back-pressure regulator 20 to ensure that the temperature of heat load 19 is maintained to within ±5 degrees C. (e.g., to within ±4 degrees C., to within ±3 degrees C., to within ±2 degrees C., to within ±1 degree C.) of the temperature set point value for heat load 19.

As discussed above, within evaporator 18, a portion of the liquid refrigerant in the two-phase refrigerant fluid mixture is converted to refrigerant vapor by undergoing a phase change. As a result, the refrigerant fluid mixture that emerges from evaporator 18 has a higher vapor quality (i.e., the fraction of the vapor phase that exists in refrigerant fluid mixture) than the refrigerant fluid mixture that enters evaporator 18.

As the refrigerant fluid mixture emerges from evaporator 18, a portion of the refrigerant fluid can optionally be used to cool one or more additional thermal loads. Typically, for example, the refrigerant fluid that emerges from evaporator 18 is nearly in the vapor phase. The refrigerant fluid vapor (or, more precisely, high vapor quality fluid vapor) can be directed into a heat exchanger coupled to another thermal load (both not shown) that absorbs heat from the additional thermal load during propagation through the heat exchanger. Examples of systems in which the refrigerant fluid emerging from evaporator 18 is used to cool additional thermal loads will be discussed in more detail subsequently.

The refrigerant fluid emerging from evaporator 18 is transported through conduit to back-pressure regulator 20, which directly or indirectly controls the upstream pressure, that is, the evaporating pressure pc in the system. After passing through the back-pressure regulator 20, the refrigerant fluid is discharged as exhaust through the exhaust line 22. Refrigerant fluid discharge can occur directly into the environment surrounding OCRS 12a. Alternatively, in some embodiments, the refrigerant fluid can be further processed, various features and aspects of such processing are discussed in further detail below.

It should be noted that the foregoing steps, while discussed sequentially for purposes of clarity, occur simultaneously and continuously during cooling operations. In other words, refrigerant liquid is continuously being discharged from the liquid-side outlet 14c of the liquid separator 14, into pump 16 that pumps the refrigerant liquid into evaporator 18, flowing continuously through evaporator 18 and removing heat from heat load 19. A mixture of refrigerant liquid and vapor emerges from the evaporator 18 and is transported to the inlet 14a of the liquid separator 14. Liquid separator 14 separates refrigerant vapor that is pulled by the back-pressure regulator 20 and is released, that is, the refrigerant is not returned to the liquid separator 14, and refrigerant liquid is discharged from the liquid-side outlet 14c and fed back to the pump inlet 16a completing the cooling operation.

During operation of OCRS 12a, as refrigerant fluid is drawn from the liquid separator 14 and used to cool heat load 19, the amount of refrigerant liquid in the liquid separator 14 is reduced. If the refrigerant liquid is reduced to a value that is too low, the pressure in the liquid separator 14 can be an indicator of the remaining operational time. An appropriate warning signal can be issued (e.g., by the controller 17 (see FIG. 10)) to indicate that, in a certain period of time, the system may no longer be able to maintain adequate cooling performance, operation of the system can even be halted.

A high flow rate, relative to an OCRS that includes a refrigerant receiver can lead to or cause a lower vapor quality that lessens the impact of refrigerant mal-distribution in the evaporator 18. Taking into consideration that pumping power in the OCRS 12a is relatively low, there is substantial room to design and employ evaporator 18 that discharges a refrigerant stream at a relatively low vapor quality (0.3 to 0.7). The evaporation generates an amount of vapor proportional to the applied heat load. The formed vapor is discharged into ambient environment via the back-pressure regulator 20 at a pressure controlled by the back-pressure regulator 20. Liquid and vapor in the liquid separator 14 are in thermal equilibrium with surrounding environment and fully defined by the environment. The back-pressure regulator 20 should be set to control a pressure at or above the saturated refrigerant pressure at the temperature of the surrounding environment.

The back-pressure regulator 20 can also be set to control a pressure below the saturated refrigerant pressure at the temperature of the surrounding environment. In this case, a refrigerant discharge occurs when the OCRS 12a is ON and the back-pressure regulator 20 is opened. It is preferred that the OCRS 12a is configured to discharge vapor only. The set pressure is virtually the saturated (or evaporating) pressure if related pressure drops are neglected.

Some of the advantages of the OCRS 12a include reducing the impact of refrigerant distribution and only require a single control device, e.g., the back-pressure regulator 20. Other advantages include the liquid separator 14 serves a liquid refrigerant storage mitigating weight considerations and further that the density of the saturated liquid at the evaporating temperature is larger than the density of the pressurized subcooled liquid, therefore, the storage volume is smaller. One drawback is that the evaporation temperature is higher than the surrounding environment.

Figure 2:
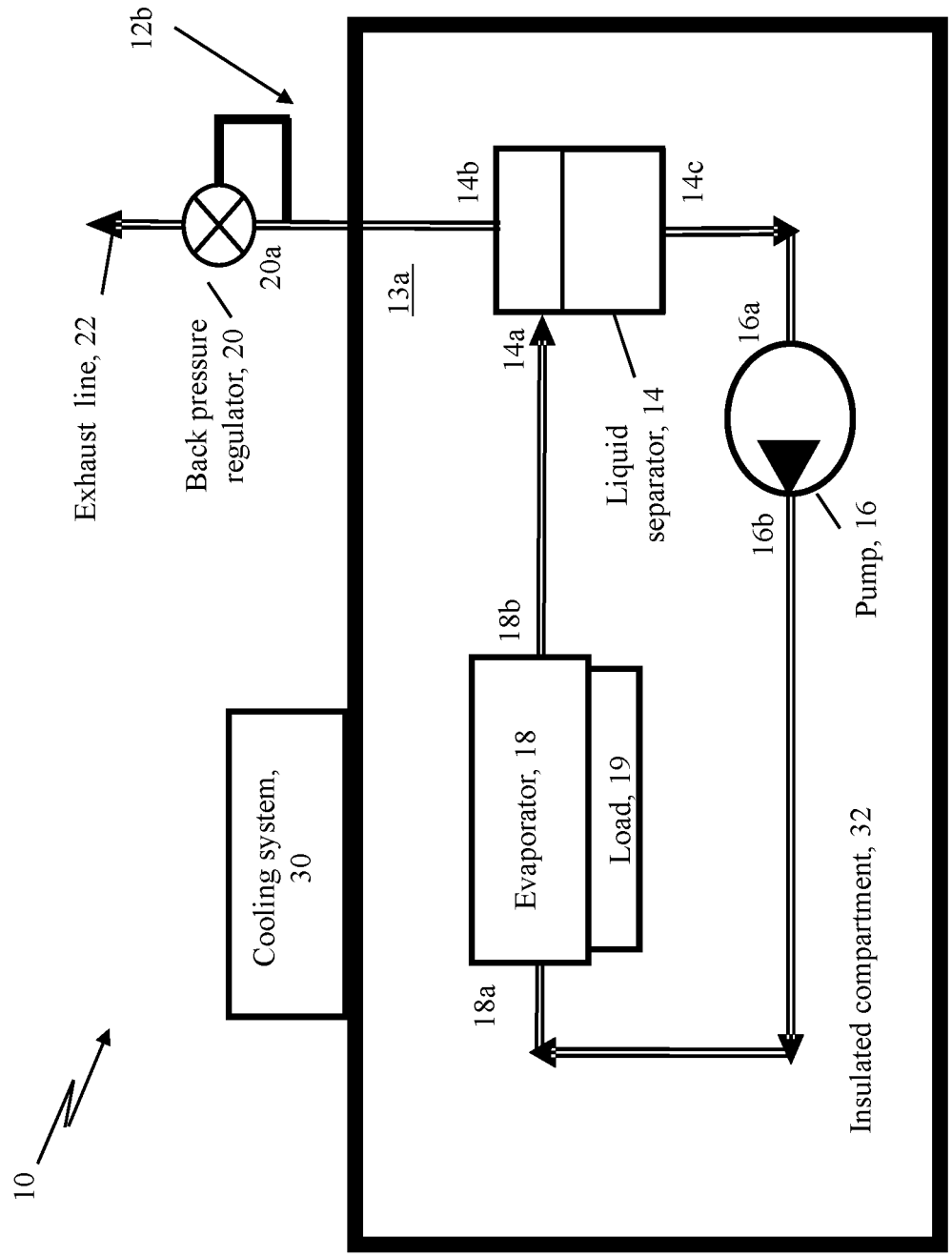
FIG. 2 is a schematic diagram of a TMS that includes an OCRS that operates at a single pressure level in a temperature-controlled environment.

Referring now to FIG. 2, an alternative OCRS 12b is shown. OCRS 12b includes all of the elements of OCRS 12a, as discussed above, arranged in the open-circuit refrigerant fluid flow path 13a that extends from the liquid-side outlet 14c, through the pump 16, the evaporator 18, the liquid separator 14, the back-pressure regulator 20 and to the exhaust line 22. However, OCRS 12b further includes an external cooling system 30 and an insulated compartment 32. The external cooling system cools the insulated compartment 32. The features of OCRS 12a are enclosed within the insulated compartment 32, with the exception of the back-pressure regulator 20 that is illustrated as being outside of the insulated compartment 32. In some implementations, the back-pressure regulator 20 may be placed inside the compartment 32, but the exhaust line 22 should direct refrigerant out of the compartment.

OCRS 12b mitigates the above-mentioned disadvantage by placing the OCRS 12b, except for the back-pressure regulator 20 (or at least the exhaust line 22), within the thermally insulated compartment 32. The cooling system 30 provides a temperature-controlled environment within the compartment 32. The back-pressure regulator 20 can be set for a pressure that is equal to or above the saturated pressure at the temperature controlled by the cooling system 30. That is, the back-pressure regulator 20 can be set to control pressure to be below the saturated refrigerant pressure at the temperature controlled by the cooling system 30. Since temperature of the heat load 19 is balanced by the enthalpy of the exhausted vapor, temperature cooling load on the external cooling system remains the same when the OCRS is ON.

Figure 3:
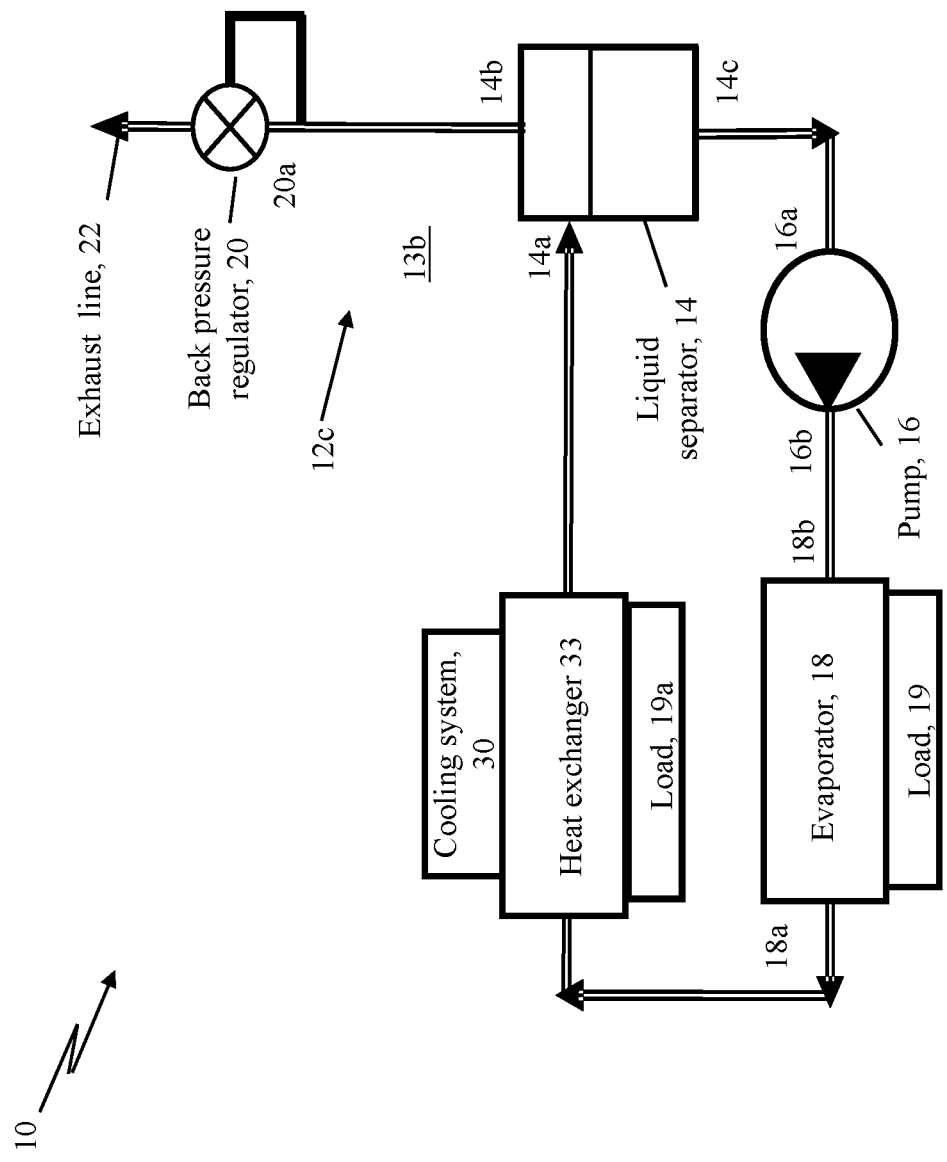
FIG. 3 is a schematic diagram of a TMS that includes an OCRS that operates at a single pressure level and includes a cooler system.

Referring now to FIG. 3, another alternative OCRS 12c is shown. OCRS 12c includes all of the elements of OCRS 12a, as discussed above and further includes the cooling system 30 within the open-circuit refrigerant fluid flow path 13b. The features of OCRS 12a are shown integrated with the cooling system 30 and a heat exchanger 33 associated with the cooling system 30. In some implementations, this arrangement can avoid the need for the thermally insulated compartment of FIG. 2. OCRS 12c is arranged in an open-circuit refrigerant fluid flow path 13b that extends from the liquid-side outlet 14c through the pump 16, the evaporator 18, the heat exchanger 33, the liquid separator 14, the back pressure regulator 20 and to the exhaust line 22.

The OCRS 12c may include a heat rejection exchanger 33 only. The heat rejection exchanger 33 may be air cooled, water cooled, or cooled by any fluid available on a vehicle or at any place where such thermal management system is installed. Fan(s) may be used to move air. Pump(s) may be used to move water. The capacity of the heat rejection exchanger unit may fully recover enthalpy of the vapor exiting the evaporator 18, by keeping the back-pressure regulator 20 closed. This can be applied for cooling low temperature heat loads 19a. Also, the heat rejection exchanger capacity can partially recover the vapor exiting the evaporator, this happens when the high temperature loads 19 are applied over short periods of operation.

OCRS 12c also mitigates the above-mentioned disadvantage by placing a closed-circuit cooling system within the OCRS 12c. This system may cool both low temperature loads 19a and high temperature loads 19. In the low temperature mode, the refrigerant exiting the evaporator 18 is cooled in the heat exchanger 33 associated with the cooling system 30. The condensed refrigerant returns to the liquid separator 14. The back-pressure regulator 20 remains in the closed position and the TMS 10 operates as a closed-circuit. In the high heat mode, the back-pressure regular 20 is engaged causing refrigerant vapor to exit the OCRS 12c via the exhaust line 22, since the OCRS 12c is not able to condense all of the refrigerant vapor formed by cooling the low heat load 19a and high heat load 19. The back-pressure regulator 20 can be set for a pressure that is equal to or above the saturated pressure at the temperature controlled by the cooling system 30. That is, the back-pressure regulator 20 can be set to control pressure to be below the saturated refrigerant pressure at the temperature controlled by the cooling system 30.

The cooling system 30 for each of FIGS. 2 and 3 may be any closed-circuit refrigeration system or available cold fluid in a vehicle or a station, in which, the OCRS 12b or 12c resides.

Figure 4A:
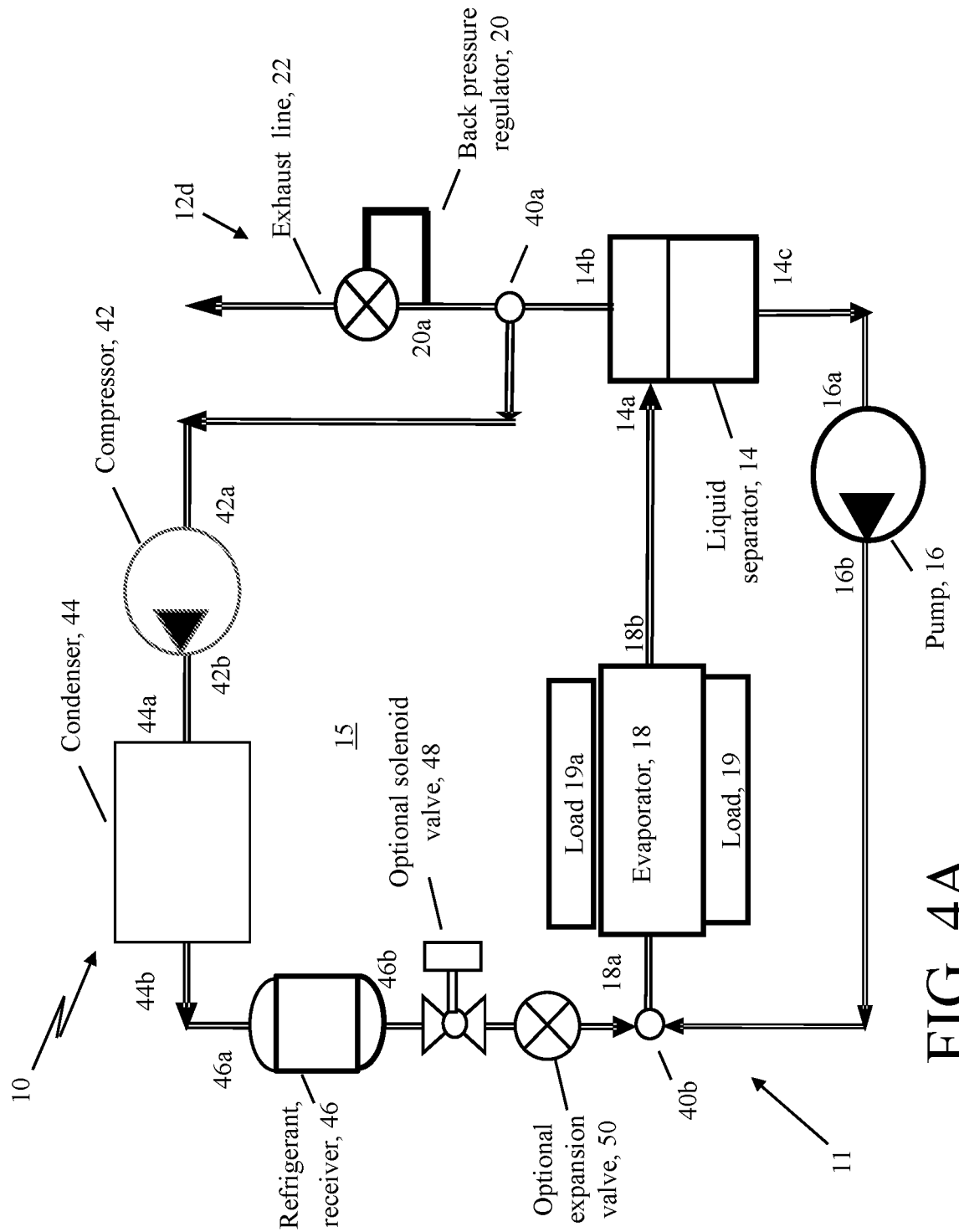
FIGS. 4A, 4B are schematic diagrams of TMS's that include an OCRS that operate at a single pressure level and which are integrated with a closed-circuit refrigeration system.

Referring now to FIG. 4A, TMS 10 includes a closed-circuit refrigeration system that is integrated with the open-circuit refrigeration system (CCRSOCRS) 11. The system of FIG. 4A comprises a built-in cooling system. CCRSOCRS 11 includes a closed-circuit refrigeration system 15 and an OCRS 12d. OCRS 12d includes the liquid separator 14, the pump 16, the evaporator 18 and the control device, e.g., the back-pressure regulator 20 having an outlet coupled to the exhaust line 22.

CCRSOCRS 11 also includes the closed-circuit refrigeration system 15 that includes a junction 40a having an inlet coupled to the vapor-side outlet 14b of the liquid separator 14 and further has two outlets. One outlet of the junction 40a is coupled to the inlet 20a to the back-pressure regulator 20 and the other outlet is coupled to an inlet 42a of a compressor 42. A compressor outlet 42b is coupled to an inlet 44a to a condenser 44, with a condenser outlet 44b coupled to an inlet 46a of a receiver 46 that stores refrigerant fluid primarily for the closed-circuit refrigeration system 15. A receiver outlet 46b is coupled to an inlet of an optional solenoid control valve 48, with an outlet of the solenoid control valve 48 coupled to an inlet of an optional expansion device 50. An outlet of the expansion device 50 is coupled to another junction device 40b having two inlets and an outlet. Junction device 40b also receives refrigerant from the pump outlet 16b and mixes the refrigerant from the receiver 46 and the pump 16 and feeds the mixed refrigerant into the inlet 18a of the evaporator 18.

The CCRSOCRS 11 looks similar to an OCRS with a pumping circuit, as described in Patent Application entitled "Thermal Management Systems," Ser. No. 16/448,196, filed Jun. 21, 2019 (assigned to the assignee of the present invention). However, the systems described in the above application are different than the CCRSOCRS 11. In the previous inventions, the receiver served as a storage of liquid refrigerant for the OCRS and the liquid separator served as a device for catching liquid exiting the evaporators so as not to have liquid at the compressor inlet.

In the current application, the liquid separator 14 does involve catching liquid from the evaporator 18 but also is a primary source of the refrigerant for OCRS 12a. On the other hand, the receiver 46 is the primary storage of refrigerant for CCRS 15. The amount of refrigerant required to operate CCRS 15 is relatively small and, thus, the receiver 46 sized to keep up with fluctuations of liquid refrigerant level in the receiver 46, which fluctuations are associated with fluctuations of ambient temperature and/or accommodate CCRS refrigerant charge after pump-down.

Optionally, the liquid refrigerant in the receiver 46 may be oversized to accommodate the entire charge of OCRS 12a during a pump-down cycle for maintenance purposes. That is, initially the receiver 46 is allowed to feed sub-cooled refrigerant to the expansion device 50 at all operating ambient conditions and all heat loads but, ultimately, the liquid separator 14 becomes the OCRS storage of refrigerant. Also, in the previous filed patent application, a liquid receiver is part of the OCRS and serves as refrigerant storage that allows a pump-down cycle, but the liquid separator is not used for storage of liquid refrigerant for that OCRS, merely being used for separation of vapor and liquid components of the refrigerant.

Figure 4B:
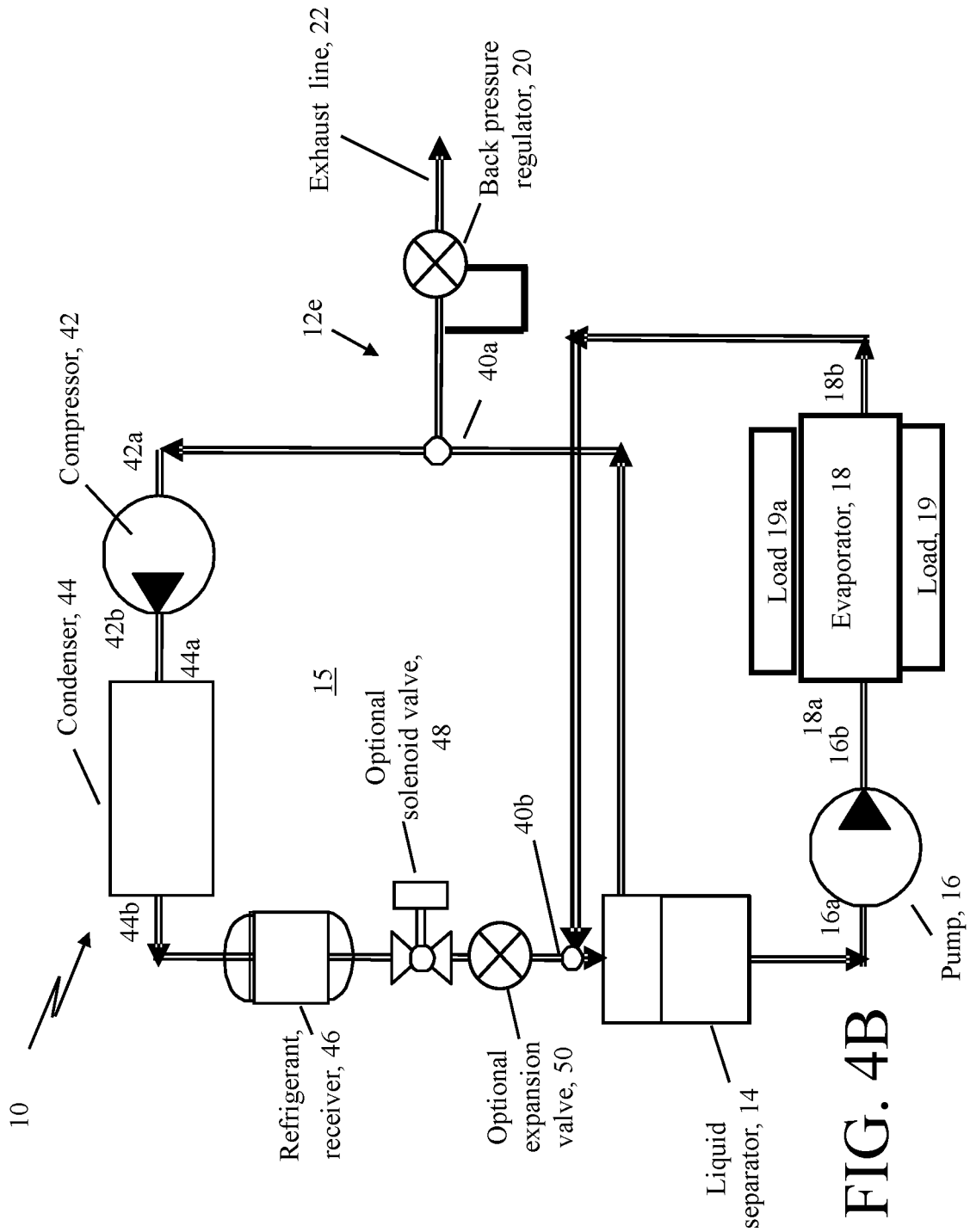

Referring now to FIG. 4B, another TMS 10 includes a closed-circuit refrigeration system that is integrated with the open-circuit refrigeration system (CCRSOCRS) 11. The system of FIG. 4B comprises a built-in cooling system. CCRSOCRS 11 includes a closed-circuit refrigeration system 15a and an OCRS 12e1. OCRS 12e includes the liquid separator 14, the pump 16, the evaporator 18 and the control device, e.g., the back-pressure regulator 20 having an outlet coupled to the exhaust line 22.

CCRSOCRS 11 also includes the closed-circuit refrigeration system 15 that includes a junction 40a having an inlet coupled to the vapor-side outlet 14b of the liquid separator 14 and further has two outlets. One outlet of the junction 40a is coupled to the inlet 20a to the back-pressure regulator 20 and the other outlet is coupled to an inlet 42a of a compressor 42. A compressor outlet 42b is coupled to an inlet 44a to a condenser 44, with a condenser outlet 44b coupled to an inlet 46a of a receiver 46 that stores refrigerant fluid primarily for the closed-circuit refrigeration system 15. A receiver outlet 46b is coupled to an inlet of an optional solenoid control valve 48, with an outlet of the solenoid control valve 48 coupled to an inlet of an optional expansion device 50. An outlet of the expansion device 50 is coupled to another junction device 40b having two inlets and an outlet. Junction device 40b also receives refrigerant from the evaporator outlet 18b and mixes with the refrigerant from the receiver 46 and feeds the mixed refrigerant into the inlet 14a of the liquid separator 14.

The liquid separator 14 catches liquid from the evaporator 18 but also is a primary source of the refrigerant for OCRS 12e. The receiver 46 is the primary storage of refrigerant for CCRS 15. The amount of refrigerant required to operate CCRS 15a is relatively small and, thus, the receiver 46 is sized to keep up with fluctuations of liquid refrigerant level in the receiver 46, which fluctuations are associated with fluctuations of ambient temperature and/or accommodate CCRS refrigerant charge after pump-down.

Optionally, the liquid refrigerant in the receiver 46 may be oversized to accommodate the entire charge of OCRS 12a during a pump-down cycle for maintenance purposes. That is, initially the receiver 46 is allowed to feed sub-cooled refrigerant to the expansion device 50 at all operating ambient conditions and all heat loads but, ultimately, the liquid separator 14 becomes the OCRS storage of refrigerant.

As described in Patent Application entitled "Thermal Management Systems," Ser. No. 16/448,196, filed Jun. 21, 2019 (assigned to the assignee of the present invention) the receiver served as a storage of liquid refrigerant for the OCRS and the liquid separator served as a device for catching liquid exiting the evaporators so as not to have liquid at the compressor inlet.

In the previous filed patent application, the liquid receiver is part of the OCRS and serves as refrigerant storage that allows a pump-down cycle, but the liquid separator is not used for storage of liquid refrigerant for that OCRS, merely being used for separation of vapor and liquid components of the refrigerant.

The embodiments depicted above may have multiple evaporators and multiple parallel pumping circuits with single or multiple different evaporators. The evaporators may cool air, fluids, and/or operate as dehumidifiers.

Expansion device 50 can be implemented as a fixed orifice, a capillary tube, and/or a mechanical or electronic expansion valve. In general, fixed orifices and capillary tubes are passive flow restriction elements which do not actively regulate refrigerant fluid flow.

Mechanical expansion valves (usually called thermostatic or thermal expansion valves) are typically flow control devices that enthalpically expand a refrigerant fluid from a first pressure to an evaporating pressure, controlling the superheat at the evaporator exit. Mechanical expansion valves generally include an orifice, a moving seat that changes the cross-sectional area of the orifice and the refrigerant fluid volume and mass flow rates, a diaphragm moving the seat, and a bulb at the evaporator exit. The bulb is charged with a fluid and it hermetically fluidly communicates with a chamber above the diaphragm. The bulb senses the refrigerant fluid temperature at the evaporator exit (or another location) and the pressure of the fluid inside the bulb, transfers the pressure in the bulb through the chamber to the diaphragm, and moves the diaphragm and the seat to close or to open the orifice.

Typical electrical expansion valves include an orifice, a moving seat, a motor or actuator that changes the position of the seat with respect to the orifice, a controller, and pressure and temperature sensors at the evaporator exit. The controller 17 (see FIG. 10) calculates the superheat for the expanded refrigerant fluid based on pressure and temperature measurements at the evaporator exit. If the superheat is above a set-point value, the seat moves to increase the cross-sectional area and the refrigerant fluid volume and mass flow rates to match the superheat set-point value. If the superheat is below the set-point value, the seat moves to decrease the cross-sectional area and the refrigerant fluid flow rates.

Examples of suitable commercially available expansion valves that can function as such a control device include, but are not limited to, thermostatic expansion valves available from the Sporlan Division of Parker Hannifin Corporation (Washington, Mo.) and from Danfoss (Syddanmark, Denmark).

III. Other Configurations

Figure 5A:
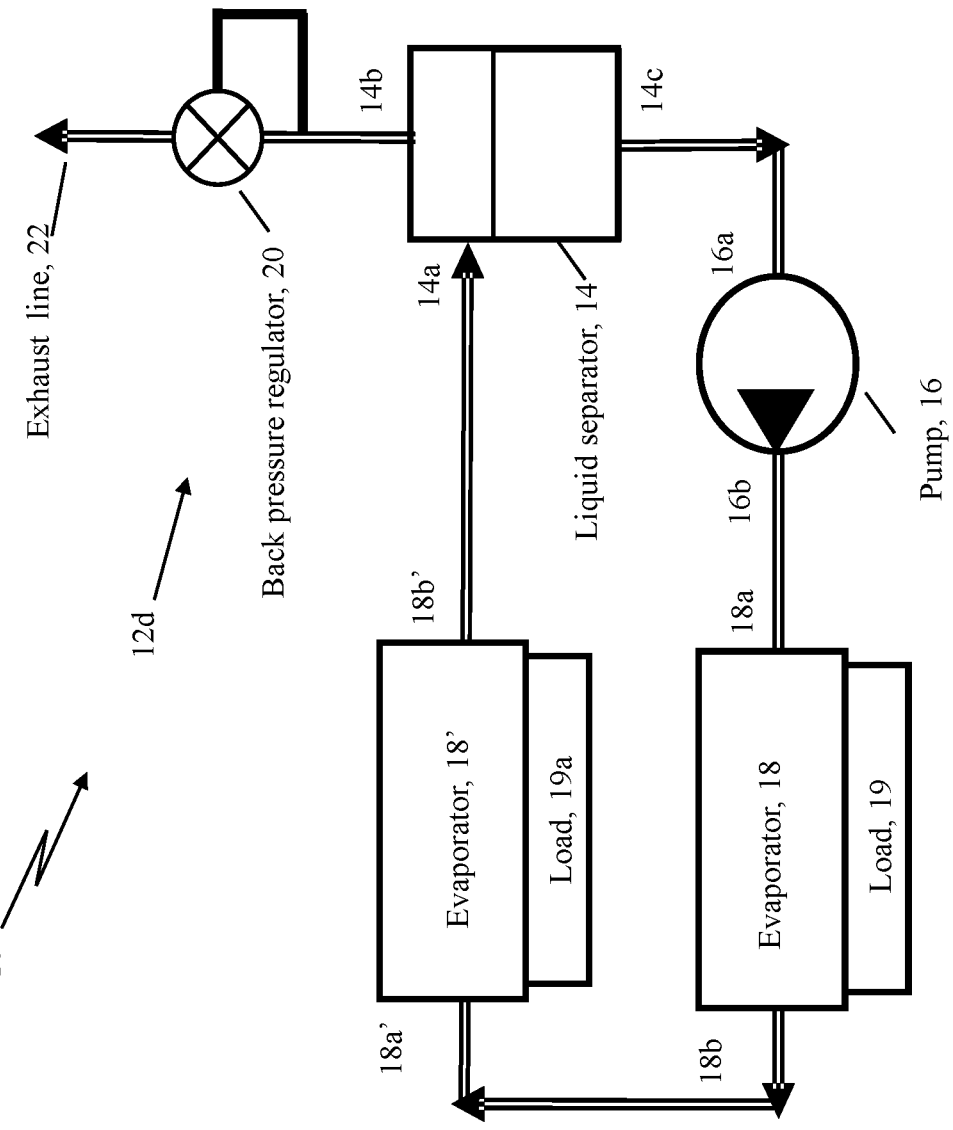
FIGS. 5A-5C are schematic diagrams of alternative TMS's.
Figure 5B:
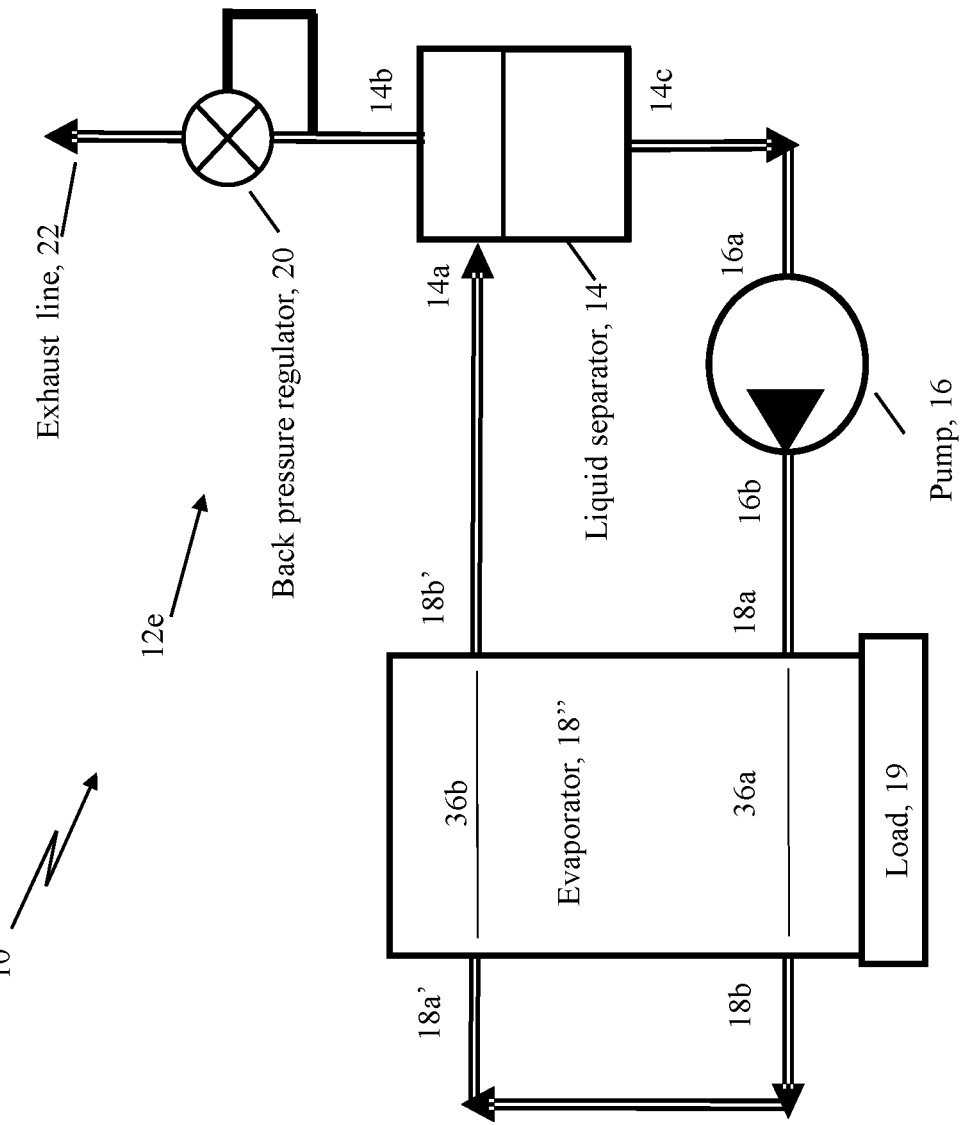
Figure 5C:
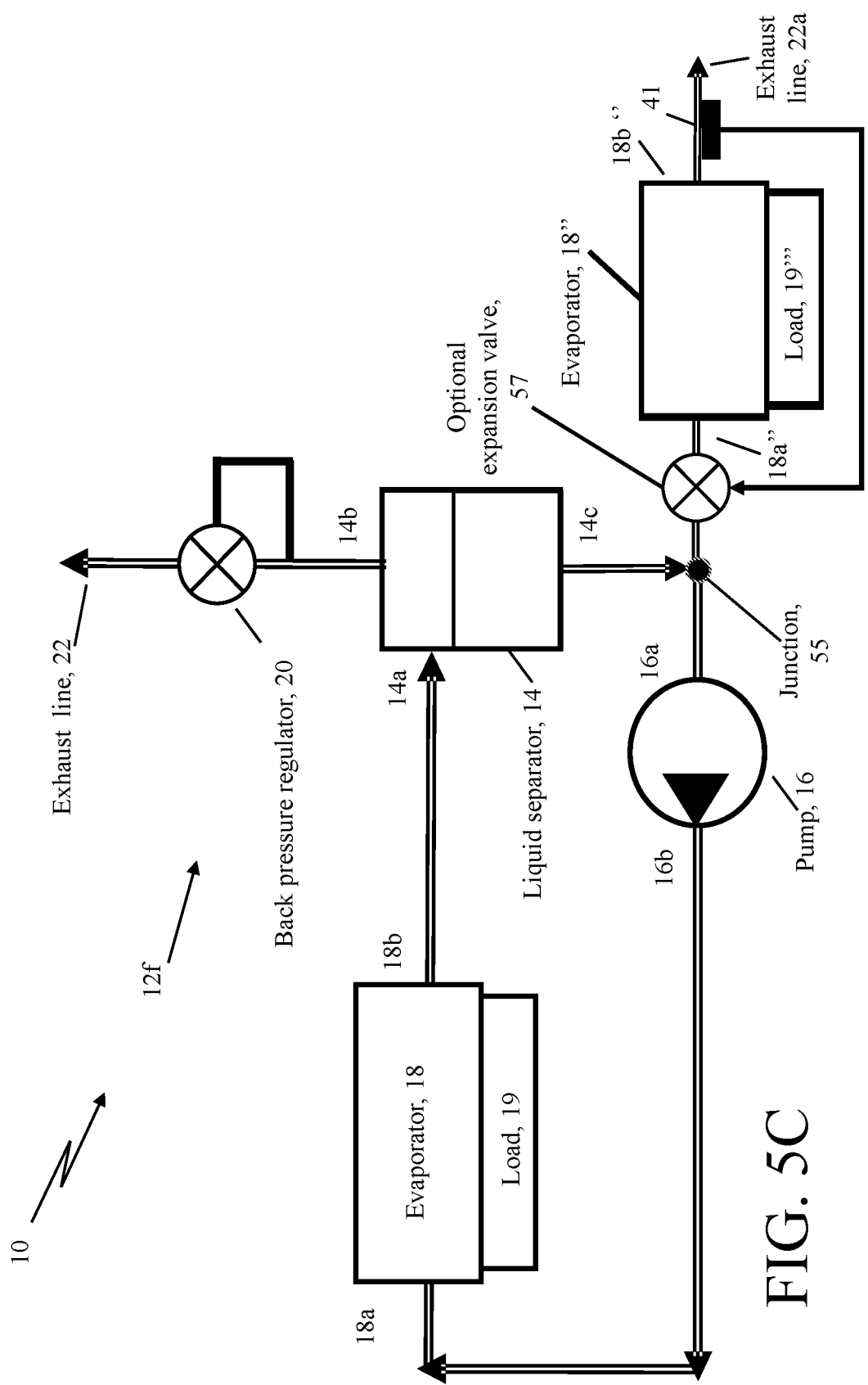

Other configurations of the evaporator are possible including two evaporators, as shown in FIG. 5A, a single evaporator as in FIG. 5B, and two evaporators with a superheat as shown in FIG. 5C.

Referring to FIG. 5A, the TMS 10 includes an open OCRS 12d. OCRS 12d includes all of the features of FIG. 1 that are generally as arranged as in FIG. 1, with the exception of the evaporator 18. In this instance OCRS 12d includes the liquid separator 14, the pump 16, the evaporator 18 that serves as a first evaporator, and further includes a second evaporator 18' having an inlet 18a' and an outlet 18b'. The inlet of evaporator 18 is coupled to the outlet 16b of the pump 16, the outlet 18b of the evaporator 18 is coupled to the inlet 18a' of the evaporator 18'. The outlet 18b' of evaporator 18' is coupled to the inlet 14a of the liquid separator 14. A control device 20 (e.g., a back-pressure regulator 20) is coupled to the vapor-side outlet 14b of the liquid separator 14. The foregoing are coupled via conduits (nor referenced). Heat loads 19, 19a are thermally coupled to the evaporators 18, 18', respectively.

Referring to FIG. 5B, the TMS 10 includes an open OCRS 12e. OCRS 12e includes all of the features of FIG. 1 that are generally as arranged as in FIG. 1, with the exception of the evaporator 18. In this instance OCRS 12e includes an exemplary single evaporator 18" as shown that is integrated version of evaporators 18 and 18'. The evaporator 18" has a heat load 19 in thermal contact with one or more integrated refrigerant fluid channels (not shown). The single evaporator has two refrigerant paths, a first path 36a is between inlet 18a and outlets 18b and a second path 36b is between inlet 18a' and outlet 18b'. The outlet 18b of the refrigerant path 36a is coupled to the inlet 18a' of the refrigerant path 36b, the inlet 18a of the refrigerant path 36a is coupled to the outlet 16b of the pump 16 and the outlet 18b' of the refrigerant path 36b is coupled to the inlet 14a of the liquid separator 14. These devices otherwise generally function as discussed above.

This configuration also permits interposing of another control device (not shown) between outlet 18b and inlet 18a', if desired. In this embodiment, the single evaporator 18" is attached downstream from and upstream of the pump 16 and requires a single evaporator in comparison with the configuration of FIG. 5A having the two evaporators 18, 18' (FIG. 5A).

Referring to FIG. 5C, another evaporator 18'" is shown coupled to the liquid-side outlet 14c of the liquid separator 14, via a junction 55. The evaporator 18'" can operate at a superheated refrigerant. The evaporator 18 has the heat load 19 and is configured to extract heat from the heat load 19. The other evaporator 18" is configured to extract heat from another heat load 19b in contact with or proximate to the evaporator 18"'. An inlet 18a" of the evaporator 18" can be is coupled to an outlet of an optional expansion device 57 that is coupled to a port of a junction device 55. The other ports of the junction device 55 are coupled to the liquid-side outlet 14c of the liquid separator 14 and the pump inlet 16a. An outlet 18b" of the evaporator 18" is coupled to a second exhaust line 22a, which can be exhaust line 22, and a sensor 41 that measures a thermodynamic property of the refrigerant at the outlet 18b" of the second evaporator 18" and generates a signal (either directly, as shown, or via the controller 17 (see FIG. 10)) to control expansion device 57 and control the superheat.

The evaporator 18 operates in two phase (liquid/gas) and the evaporator 18" operates in superheated region with controlled superheat. The controller 17 (see FIG. 10) can be included to control operation of, e.g., devices 16, 50, and 57, etc., for instance.

Figure 5D:
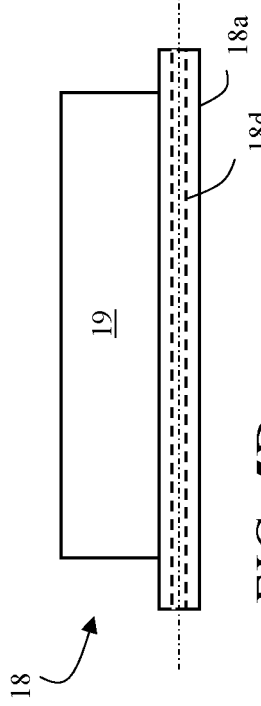
FIGS. 5D and 5E are schematic diagrams showing side and end views, respectively, of an example of a thermal load that includes refrigerant fluid channels.
Figure 5E:
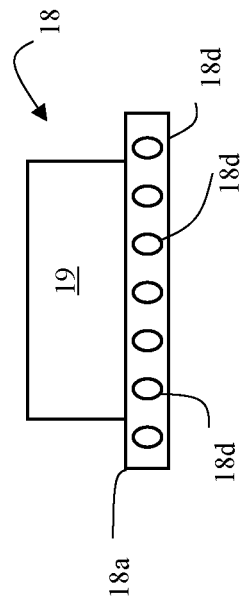

Referring now to FIGS. 5D and 5E, an exemplary evaporator 18 is shown. The evaporator 18 has the heat load 19 in thermal contact with one or more integrated refrigerant fluid channels 18d. The portion of head load 19 in thermal contact with the refrigerant fluid channels 18d effectively functions as the evaporator 18 for the system 10. In some embodiments, evaporator 18 (or certain components thereof) can be fabricated as part of heat load 19 or otherwise integrated into heat load 19.

Evaporator 18 can be implemented in a variety of ways. In general, evaporator 18 functions as a heat exchanger, providing thermal contact between the refrigerant fluid and heat load 19. Typically, evaporator 18 includes one or more flow channels 18d extending internally between the inlet 18a and the outlet 18b of the evaporator, allowing refrigerant fluid to flow through the evaporator and absorb heat from heat load 19.

A variety of different evaporators can be used in system 10. In general, any cold plate may function as the evaporator of the open-circuit refrigeration systems 12 disclosed herein. Evaporator 18 can accommodate any refrigerant fluid channels (including mini/micro-channel tubes), blocks of printed circuit heat exchanging structures, or more generally, any heat exchanging structures that are used to transport single-phase or two-phase fluids. The evaporator and/or components thereof, such as fluid transport channels, can be attached to the heat load mechanically, or can be welded, brazed, or bonded to the heat load in any manner.

In the example of FIG. 1, the operating pressure in the evaporator 18 tends to be in equilibrium with the surrounding temperature and is different for different refrigerants. The pressure in the evaporator 18 also depends on the evaporating temperature, which is lower than the heat load temperature and is defined during design of the system. The system is operational as long as there is sufficient liquid refrigerant in the liquid separator 14 to drive adequate refrigerant fluid flow through the evaporator 18.

Figure 6:
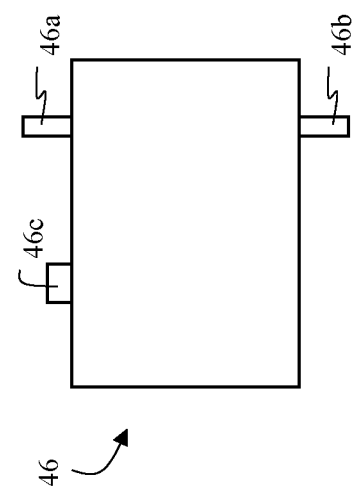
FIG. 6 is a schematic diagram of a receiver.

FIG. 6 shows an example of a receiver 46. Receiver 46 includes an inlet port 46a, an outlet port 46b. Receiver 46 may include a pressure relief valve 46c. Receiver 46 can have a variety of different shapes. In some embodiments, for example, the receiver is cylindrical. Examples of other possible shapes include, but are not limited to, rectangular prismatic, cubic, and conical.

Figure 6A:
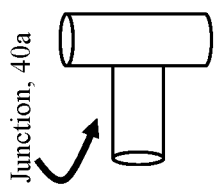
FIG. 6A is a schematic diagram of a junction device.

FIG. 6A shows an example of a junction device 40a having three ports any of which can be either inlets or outlets.

IV. System Operational Control

An important system operating parameter is the vapor quality of the refrigerant fluid emerging from evaporator 18. The vapor quality, which is a number from 0 to 1, represents the fraction of the refrigerant fluid that is in the vapor phase. As mentioned above, for a particular volume of refrigerant fluid propagating through evaporator 18, relatively high amounts of the refrigerant fluid can remain in liquid form right up to the point at which the exit aperture of evaporator 18 is reached. Also, if the fluid is fully converted to the vapor phase after propagating only partially through evaporator 18, further heat absorption by the (now vapor-phase) refrigerant fluid within evaporator 18 will lead to a temperature increase of the refrigerant fluid and heat load 19.

The evaporator 18 is configured to maintain exit vapor quality substantially below the critical vapor quality defined as "1." Vapor quality is the ratio of mass of vapor to mass of liquid+vapor and is generally kept in a range of approximately 0.3 to almost 1.0, more specifically 0.3 to 0.8 and any value within said range. "Vapor quality" thus when defined as mass of vapor/total mass (vapor+liquid), in this sense, the vapor quality cannot exceed "1" or be equal to a value less than "0."

In practice, vapor quality may be expressed as "equilibrium thermodynamic quality" that is calculated as follows:

$$X=(h-h')/(h''-h'),$$

where h− is specific enthalpy, specific entropy or specific volume, '− means saturated liquid and "− means saturated vapor. In this case X can be mathematically below 0 or above 1, unless the calculation process is forced to operate differently. Either approach is acceptable.

Another important operating consideration for TMS 10 is the mass flow rate of refrigerant fluid within the system. Evaporator 18 can be configured to provide a higher mass flow rate controlling lower vapor quality than the arrangement in the above application. In general, a more limited number of measurement and control strategies can be implemented in TMS 10 to achieve the control objectives discussed above.

The back-pressure regulator 20 can also be optionally implemented as a mechanical back-pressure regulator (or electrically control-able). In general, mechanical back-pressure regulators that are suitable for use in the systems disclosed herein include an inlet, an outlet, and an adjustable internal orifice. To regulate the internal orifice, the mechanical back-pressure regulator senses the in-line pressure of refrigerant fluid entering through the inlet, and adjusts the size of the orifice accordingly to control the flow of refrigerant fluid through the regulator and, thus, to regulate the upstream refrigerant fluid pressure in the system.

In some embodiments, the systems disclosed herein can include measurement devices featuring one or more system sensors and/or measurement devices that measure various system properties and operating parameters, and transmit electrical signals corresponding to the measured information. To measure the evaporating pressure ($p_e$), a sensor is optionally positioned between the inlet 18a and outlet 18b of evaporator 18, i.e., internal to evaporator 18.

TMS 10 includes an optional temperature sensor positioned adjacent to the inlet 18a or the outlet 18b of evaporator 18 or between the inlet 18a and the outlet 18b.

The foregoing temperature sensors can be implemented in a variety of ways in system 10, e. g., as thermocouples and thermistors. TMS 10 can include a vapor quality sensor that measures vapor quality of the refrigerant fluid emerging from evaporator 18. Examples of commercially available vapor quality sensors include, but are not limited to, HBX sensors (available from HB Products, Hasselager, Denmark).

It should be appreciated that in the foregoing discussion, any one or various combinations of two sensors can be used.

Certain set point values represent a maximum allowable value of a system parameter, and if the measured value is equal to the set point value (or differs from the set point value by 10% or less (e.g., 5% or less, 3% or less, 1% or less) of the set point value), the controller 17 (see FIG. 10) adjusts the back-pressure regulator 20 to adjust the operating state of the TMS 10, and reduce the system parameter value.

Certain set point values represent a minimum allowable value of a system parameter, and if the measured value is equal to the set point value (or differs from the set point value by 10% or less (e.g., 5% or less, 3% or less, 1% or less) of the set point value), controller 17 (see FIG. 10) adjusts back-pressure regulator 20 to adjust the operating state of the system, and increase the system parameter value.

Some set point values represent "target" values of system parameters. For such system parameters, if the measured parameter value differs from the set point value by 1% or more (e.g., 3% or more, 5% or more, 10% or more, 20% or more), controller 17 (see FIG. 10) adjusts back-pressure regulator 20 to adjust the operating state of the system, so that the system parameter value more closely matches the set point value.

In the foregoing examples, measured parameter values are assessed in relative terms based on set point values (i.e., as a percentage of set point values). Alternatively, in some embodiments, measured parameter values can be assessed in absolute terms. For example, if a measured system parameter value differs from a set point value by more than a certain amount (e.g., by 1 degree C. or more, 2 degrees C. or more, 3 degrees C. or more, 4 degrees C. or more, 5 degrees C. or more), then controller 17 (see FIG. 10) adjusts back-pressure regulator 20 to adjust the operating state of the system, so that the measured system parameter value more closely matches the set point value.

Figure 7:
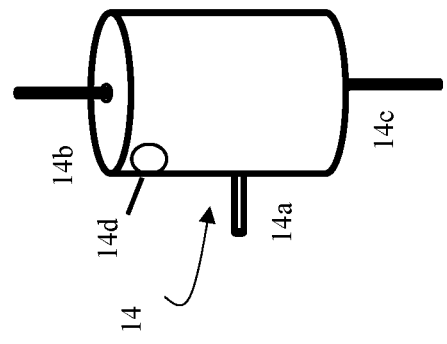
FIG. 7 is a schematic diagram of a liquid separator.

FIG. 7 depicts a flash drum liquid separator 14 having inlet 14a, vapor-side outlet 14b and liquid-side outlet 14c. The liquid separator 14 also can have a sensor 14d. With the use of pump 16, this configuration of the liquid separator may introduce undesirable cavitation and the pump inlet.

Figure 7C:
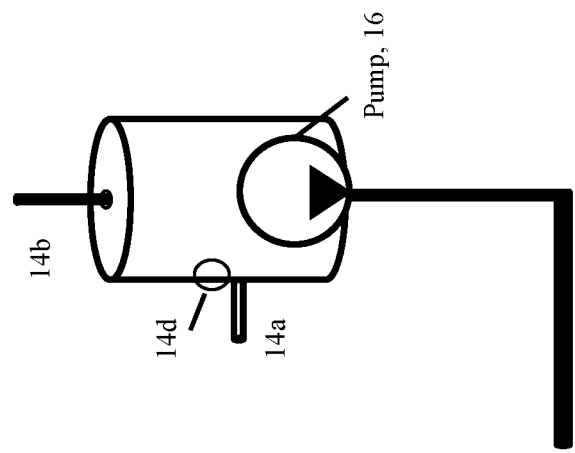
FIGS. 7A-7C are schematic diagrams of configurations for coupling of a liquid separator in the TMS.
Figure 7B:
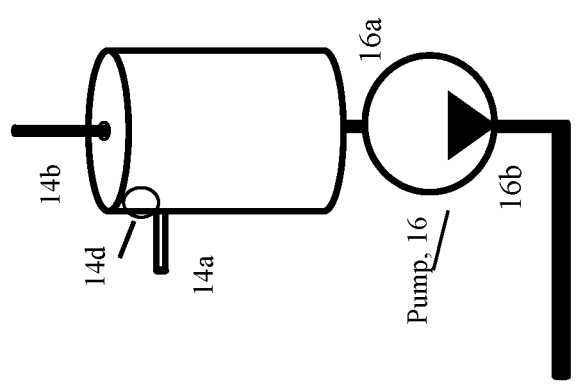
Figure 7A:
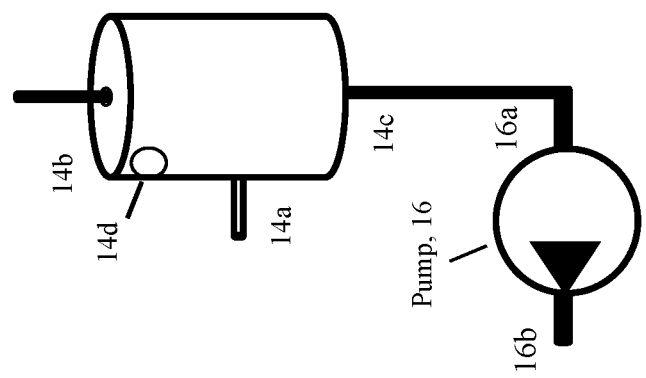

FIGS. 7A-7C depict alternative configurations of the liquid separator 14 (implemented as a flash drum, for example), which has ports 14a-14c coupled to conduits (not referenced), especially useful for the open-circuit refrigeration system configurations.

In FIG. 7A, the pump 16 is located distal from the liquid separator port 14c. This configuration potentially presents the possibility of cavitation. To minimize the possibility of cavitation, one of the configurations of FIG. 7B or 7C can be used.

In FIG. 7B, the pump 16 is located distal from the liquid separator port 14c, but the height at which the inlet 14a is located is higher than that of FIG. 7A. This would result in an increase in liquid pressure at the liquid-side outlet 14c of the liquid separator 14 and concomitant therewith an increase in liquid pressure at the inlet 16a of the pump 16. Increasing the pressure at the inlet 16a to the pump 16 should minimize possibility of cavitation.

Another strategy is presented in FIG. 7C, where the pump 16 is located proximate to or indeed, as shown, inside of the liquid separator port 14c. In addition, although not shown, the height at which the inlet 14a is located can be adjusted to that of FIG. 7B, rather than the height of FIG. 7A as shown in FIG. 7C. This would result in an increase in liquid pressure at the inlet 16a of the pump 16 further minimizing the possibility of cavitation.

Another alternative strategy that can be used for any of the configurations depicted involves the use of a sensor 14d that produces a signal that is a measure of the height of a column of liquid in the liquid separator 14. The signal is sent to the controller 17 (see FIG. 10) that will be used to start the pump 16, once a sufficient height of liquid is contained by the liquid separator 14.

V. Additional Features of Thermal Management Systems

The foregoing examples of TMS illustrate a number of features that is included in any of the systems within the scope of this description. In addition, a variety of other features is present in such systems.

In certain embodiments, refrigerant fluid that is discharged from evaporator 18 and passes through conduit and back-pressure regulator 20 is directly discharged as exhaust from conduit without further treatment. Direct discharge provides a convenient and straightforward method for handling spent refrigerant, and has the added advantage that over time, the overall weight of the system is reduced due to the loss of refrigerant fluid. For systems that are mounted to small vehicles or are otherwise mobile, this reduction in weight is important.

In some embodiments, however, refrigerant fluid vapor is further processed before it is discharged. Further processing may be desirable depending upon the nature of the refrigerant fluid that is used, as direct discharge of unprocessed refrigerant fluid vapor may be hazardous to humans and/or may deleterious to mechanical and/or electronic devices in the vicinity of the system. For example, the unprocessed refrigerant fluid vapor may be flammable or toxic, or may corrode metallic device components. In situations such as these, additional processing of the refrigerant fluid vapor may be desirable.

In general, refrigerant processing apparatus can be implemented in various ways. In some embodiments, refrigerant processing apparatus is a chemical scrubber or water-based scrubber. Within apparatus, the refrigerant fluid is exposed to one or more chemical agents that treat the refrigerant fluid vapor to reduce its deleterious properties. For example, where the refrigerant fluid vapor is basic (e.g., ammonia) or acidic, the refrigerant fluid vapor can be exposed to one or more chemical agents that neutralize the vapor and yield a less basic or acidic product that can be collected for disposal or discharged from apparatus.

Another example has the refrigerant vapor exposed to one or more chemical agents that oxidize, reduce, or otherwise react with the refrigerant fluid vapor to yield a less reactive product that is collected for disposal or discharged from apparatus. Other examples are possible.

In certain embodiments, refrigerant processing apparatus is implemented as an adsorptive sink for the refrigerant fluid. Apparatus can include, for example, an adsorbent material bed that binds particles of the refrigerant fluid vapor, trapping the refrigerant fluid within apparatus and preventing discharge. The adsorptive process can sequester the refrigerant fluid particles within the adsorbent material bed, which can then be removed from apparatus and sent for disposal.

In some embodiments, where the refrigerant fluid is flammable, refrigerant processing apparatus is implemented as an incinerator. Incoming refrigerant fluid vapor is mixed with oxygen or another oxidizing agent and ignited to combust the refrigerant fluid. The combustion products is discharged from the incinerator or collected (e.g., via an adsorbent material bed) for later disposal.

As an alternative, refrigerant processing apparatus can also be implemented as a combustor of an engine or another mechanical power-generating device. Refrigerant fluid vapor from is mixed with oxygen, for example, and combusted in a piston-based engine or turbine to perform mechanical work, such as providing drive power for a vehicle or driving a generator to produce electricity. In certain embodiments, the generated electricity is used to provide electrical operating power for one or more devices, including thermal load.

VI. Integration with Power Systems

In some embodiments, the refrigeration systems disclosed herein can be combined with power systems to form integrated power and thermal systems, in which certain components of the integrated systems are responsible for providing refrigeration functions and certain components of the integrated systems are responsible for generating operating power.

Figure 8:
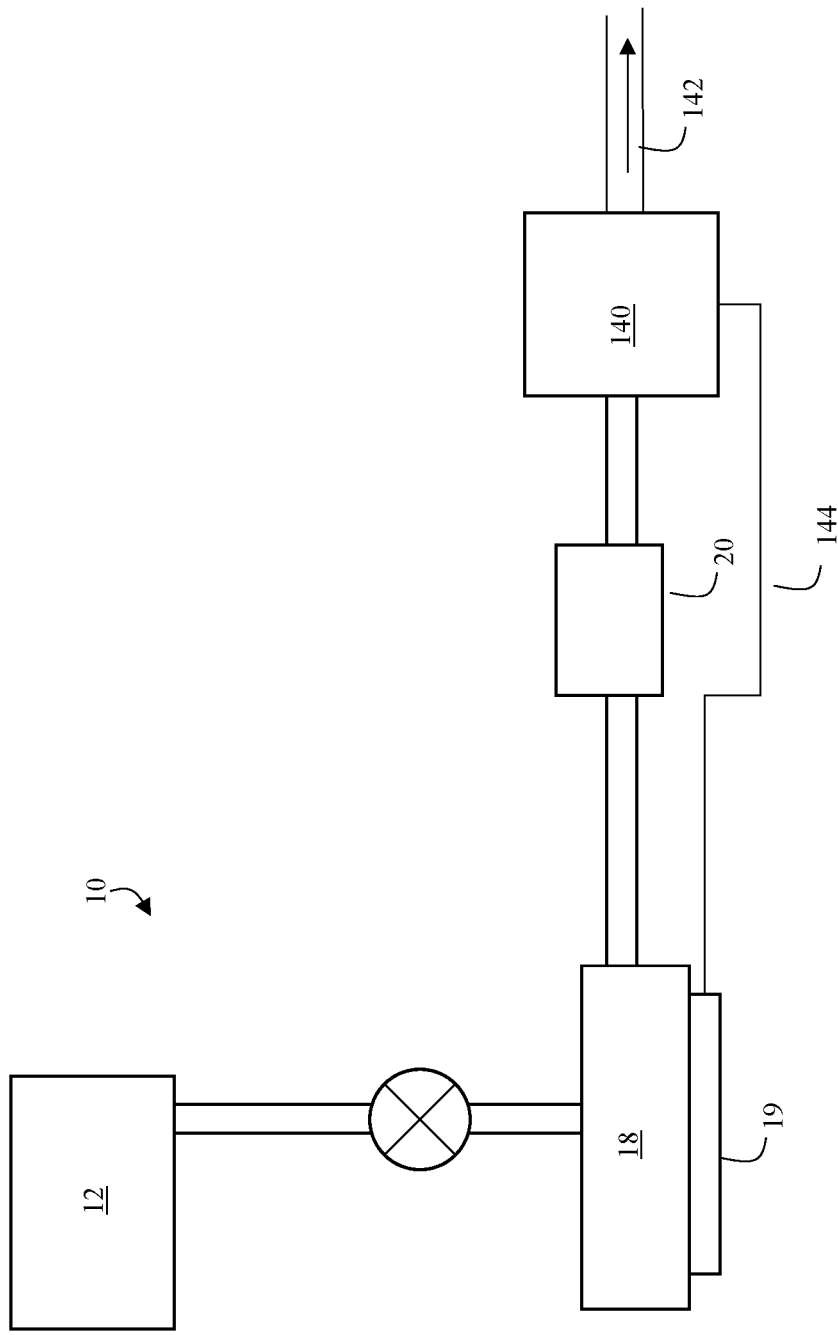
FIG. 8 is a schematic diagram of an example of a TMS that includes a power generation apparatus.

FIG. 8 shows an integrated power and TMS 10 that includes many features similar to those discussed above. In addition, TMS 10 includes an engine 140 with an inlet that receives the stream of waste refrigerant fluid that enters conduit after passing through back-pressure regulator 20. Engine 140 can combust the waste refrigerant fluid directly, or alternatively, can mix the waste refrigerant fluid with one or more additives (such as oxidizers) before combustion. Where ammonia is used as the refrigerant fluid in system 10, suitable engine configurations for both direct ammonia combustion as fuel, and combustion of ammonia mixed with other additives, can be implemented. In general, combustion of ammonia improves the efficiency of power generation by the engine.

The energy released from combustion of the refrigerant fluid can be used by engine 140 to generate electrical power, e.g., by using the energy to drive a generator. The electrical power is delivered via electrical connection 144 to thermal load 19 to provide operating power for the load. For example, in certain embodiments, thermal load 19 includes one or more electrical circuits and/or electronic devices, and engine 140 provides operating power to the circuits/devices via combustion of refrigerant fluid. Byproducts of the combustion process is discharged from engine 140 via exhaust conduit 142.

Various types of engines and power-generating devices are implemented as engine 140 in system 140. In some embodiments, for example, engine 140 is a conventional four-cycle piston-based engine, and the waste refrigerant fluid is introduced into a combustor of the engine. In certain embodiments, engine 140 is a gas turbine engine, and the waste refrigerant fluid is introduced via the engine inlet to the afterburner of the gas turbine engine.

VII. Integration with Directed Energy Systems

The TMS and methods disclosed herein can be implemented as part of (or in conjunction with) directed energy systems such as high energy laser systems. Due to their nature, directed energy systems typically present a number of cooling challenges, including certain heat loads for which temperatures are maintained during operation within a relatively narrow range.

Figure 9:
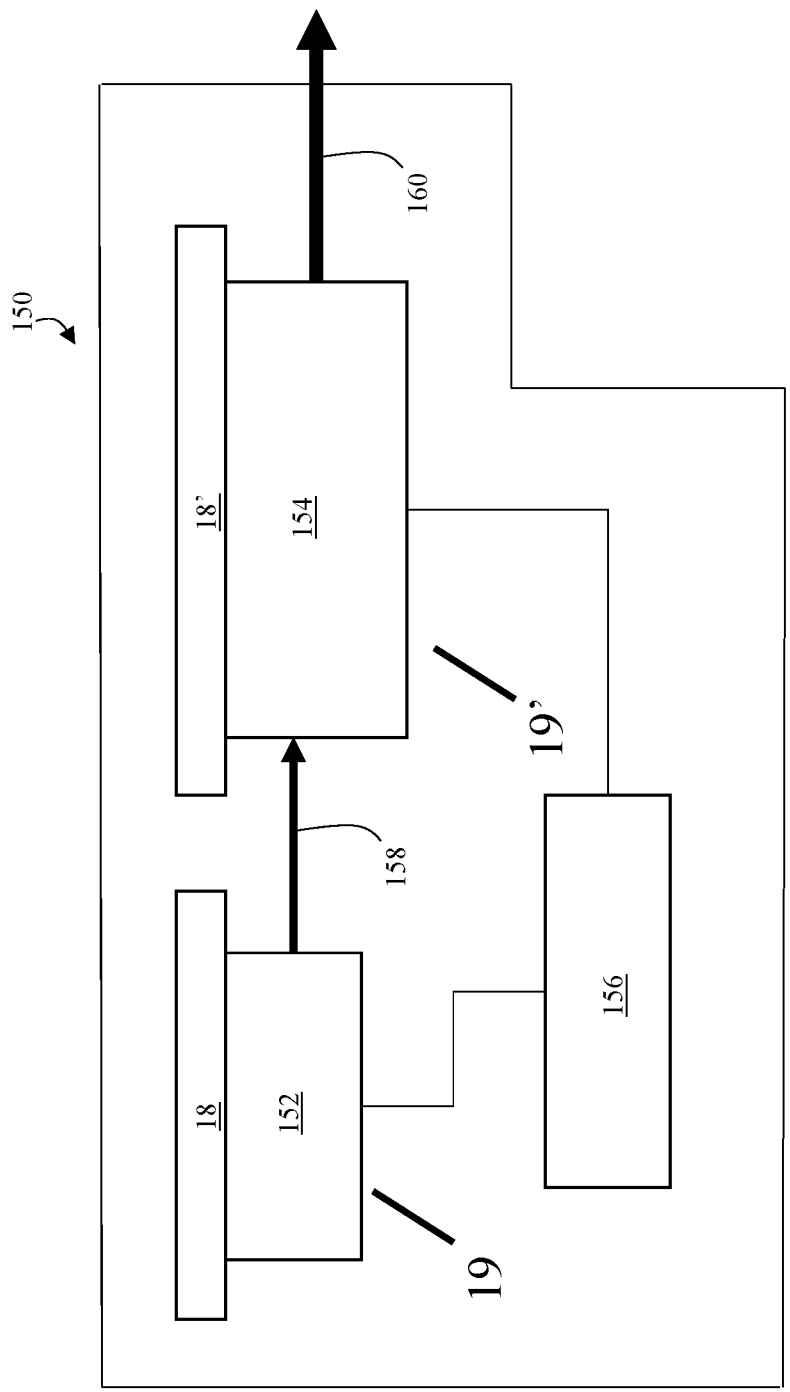
FIG. 9 is a schematic diagram of an example of directed energy system that includes a TMS.

FIG. 9 shows one example of a directed energy system, specifically, a high energy laser system 150. System 150 includes a bank of one or more laser diodes 152 and an amplifier 154 connected to a power source 156. During operation, laser diodes 152 generate an output radiation beam 158 that is amplified by amplifier 154, and directed as output beam 160 onto a target. Generation of high energy output beams can result in the production of significant quantities of heat. Certain laser diodes, however, are relatively temperature sensitive, and the operating temperature of such diodes is regulated within a relatively narrow range of temperatures to ensure efficient operation and avoid thermal damage. Amplifiers are also temperature-sensitive, although typically less sensitive than diodes.

To regulate the temperatures of various components of directed energy systems such as diodes 152 and amplifier 154, such systems can include components and features of the TMS disclosed herein. In FIG. 9, evaporator 18 is coupled to diodes 152, while evaporator 18' is coupled to amplifier 154. The other components of the TMS disclosed herein are not shown for clarity. However, it should be understood that any of the features and components discussed above can optionally be included in directed energy systems. Diodes 152, due to their temperature-sensitive nature, effectively function as heat load 19 in system 150, while amplifier 154 functions as heat load 19a.

System 150 is one example of a directed energy system that can include various features and components of the TMS and methods described herein. However, it should be appreciated that the TMS and methods are general in nature, and is applied to cool a variety of different heat loads under a wide range of operating conditions.

VIII. Hardware and Software Implementations

Figure 10:
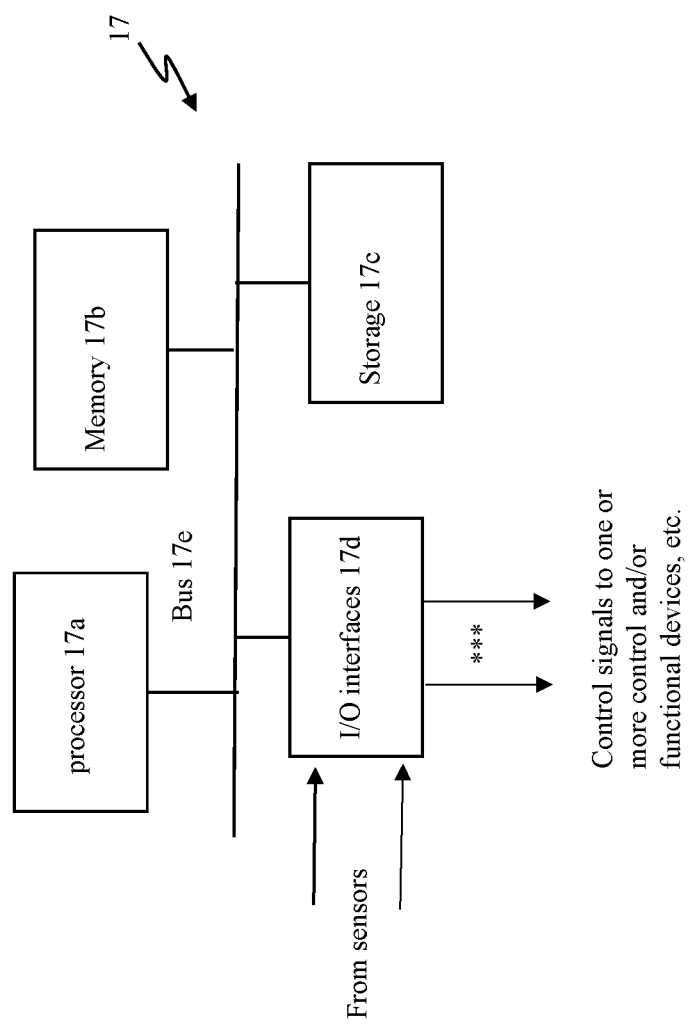
FIG. 10 is a schematic diagram of a controller.

Referring now to FIG. 10, a controller 17 can generally be implemented as any one of a variety of different electrical or electronic computing or processing devices, and can perform any combination of the various steps discussed above to control various components of the disclosed TMS.

Controller 17 can generally, and optionally, include any one or more of a processor (or multiple processors) 17a, a memory 17b, a storage device 17c, and input/output interfaces 17d. Some or all of these components is interconnected using a system bus 17e. The processor 17a is capable of processing instructions for execution. In some embodiments, the processor 17a is a single-threaded processor. In certain embodiments, the processor 17a is a multi-threaded processor. Typically, the processor 17a is capable of processing instructions stored in the memory 17b or on the storage device 17c to display graphical information for a user interface coupled via the input/output interfaces 17d, and to execute the various monitoring and control functions discussed above. Suitable processors for the systems disclosed herein include both general and special purpose microprocessors, and the sole processor or one of multiple processors of any kind of computer or computing device.

The memory 17b stores information within the system, and is a computer-readable medium, such as a volatile or non-volatile memory. The storage device 17c is capable of providing mass storage for the controller 17. In general, the storage device 17c can include any non-transitory tangible media configured to store computer readable instructions. For example, the storage device 17c can include a computer-readable medium and associated components, including magnetic disks, such as internal hard disks and removable disks, magneto-optical disks, and optical disks. Storage devices suitable for tangibly embodying computer program instructions and data include all forms of non-volatile memory including, by way of example, semiconductor memory devices, such as EPROM, EEPROM, and flash memory devices, magnetic disks such as internal hard disks and removable disks, magneto-optical disks, and CD-ROM and DVD-ROM disks. Processors and memory units of the systems disclosed herein is supplemented by, or incorporated in, ASICs (application-specific integrated circuits).

The input/output interfaces 17d provide input/output operations for controller 17, and can include a keyboard and/or pointing device. In some embodiments, the input/output interfaces 17d include a display unit for displaying graphical user interfaces and system related information.

The features described herein, including components for performing various measurement, monitoring, control, and communication functions, is implemented in digital electronic circuitry, or in computer hardware, firmware, or in combinations of them. Methods steps are implemented in a computer program product tangibly embodied in an information carrier, e.g., in a machine-readable storage device, for execution by a programmable processor (e.g., of controller 17), and features are performed by a programmable processor executing such a program of instructions to perform any of the steps and functions described above. Computer programs suitable for execution by one or more system processors include a set of instructions that is used, directly or indirectly, to cause a processor or other computing device executing the instructions to perform certain activities, including the various steps discussed above.

Computer programs suitable for use with the systems and methods disclosed herein is written in any form of programming language, including compiled or interpreted languages, and is deployed in any form, including as stand-alone programs or as modules, components, subroutines, or other units suitable for use in a computing environment.

In addition to one or more processors and/or computing components implemented as part of controller 17, the systems disclosed herein can include additional processors and/or computing components within any of the control devices and/or back-pressure regulator 20 and any of the sensors discussed above. Processors and/or computing components of the control device and sensors, and software programs and instructions that are executed by such processors and/or computing components, can generally have any of the features discussed above in connection with controller 17.

Other Embodiments

A number of embodiments have been described. Nevertheless, it will be understood that various modifications may be made without departing from the spirit and scope of the disclosure. Accordingly, other embodiments are within the scope of the following claims.

What is claimed is:

1. A thermal management system, comprises:
   an open-circuit refrigeration system comprising:
   a liquid separator configured to store a refrigerant fluid, the liquid separator having an inlet, a vapor-side outlet, and a liquid-side outlet;
   a pump having a pump inlet and a pump outlet, with the pump inlet configured to receive a refrigerant liquid from the liquid-side outlet, and the pump is configured to pump the refrigerant liquid received from the liquid-side outlet;
   a first evaporator having a first evaporator inlet and a first evaporator outlet and configured to extract heat from at least one first heat first load in thermal contact with or in thermal proximity to the first evaporator;
   a second evaporator having a second evaporator inlet and a second evaporator outlet and configured to extract heat from at least one second heat load in thermal contact with or in thermal proximity to the second evaporator;
   an exhaust line; and
   a flow control device coupled between the vapor-side outlet and the exhaust line and configured to control a temperature of the at least one second heat load, with the liquid separator, the first evaporator, the second evaporator, the flow control device, and the exhaust line coupled to form an open-circuit refrigerant flow path.

2. The thermal management system of claim 1, wherein the open-circuit refrigerant flow path consists essentially of the flow control device, the exhaust line, the first evaporator, the second evaporator, and the liquid separator.

3. The thermal management system of claim 1, wherein the pump is configured to:
   receive the refrigerant liquid from the liquid separator at a single pressure and direct the refrigerant fluid as a mixed-phase refrigerant fluid into the first evaporator at the single pressure.

4. The thermal management system of claim 1, wherein the flow control device is a back-pressure regulator.

5. The thermal management system of claim 1, wherein the flow control device is configured to receive refrigerant vapor generated in the second evaporator, and configured to regulate a pressure of the refrigerant fluid upstream of the flow control device along the open-circuit refrigerant flow path.

6. The thermal management system of claim 5, wherein the flow control device is a back-pressure regulator.

7. The thermal management system of claim 1, wherein the refrigerant fluid from the exhaust line is discharged so that the discharged refrigerant fluid is not returned to the liquid separator.

8. The system of claim 1, further comprising:
   a refrigerant processing apparatus coupled to the exhaust line and configurable to receive discharged refrigerant from the evaporator.

9. The thermal management system of claim 8, wherein the refrigerant processing apparatus comprises at least one of: i) a chemical scrubber configured to convert the refrigerant fluid into one or more products that are chemically different from the refrigerant fluid, the chemical scrubber coupled to the exhaust line and configured to receive discharged refrigerant fluid from the second evaporator; d) an adsorbent material configured to adsorb particles of the refrigerant fluid, the absorbent material coupled to the exhaust line and configured to receive discharged refrigerant fluid from the second evaporator; or iii) an incinerator configured to incinerate the refrigerant fluid, the incinerator coupled to the exhaust line and configured to receive discharged refrigerant fluid from the second evaporator.

10. The thermal management system of claim 1, wherein at least one of the at least one first heat load and the at least one second heat load comprises one or more diodes of a directed energy system.

11. The thermal management system of claim 1, wherein the first evaporator outlet is coupled to the second evaporator inlet, the second evaporator outlet is coupled to the inlet of the liquid separator, and the first evaporator inlet is coupled to the pump outlet.

12. The thermal management system of claim 1, wherein the first and second evaporators are integrated into a single evaporator that has a first refrigerant path and a second refrigerant path.

13. The thermal management system of claim 12, wherein the first refrigerant path has an inlet coupled to the outlet of the pump and having an outlet of the first refrigerant path coupled to an inlet of the second refrigerant path, and with an outlet of the second refrigerant path coupled to the inlet of the liquid separator.

14. The thermal management system of claim 12, wherein the refrigerant fluid comprises ammonia.

15. The thermal management system of claim 1, wherein the first evaporator inlet is coupled to the pump outlet and the first evaporator outlet is coupled to the inlet of the liquid separator, and with the second evaporator inlet coupled to the liquid-side outlet of the liquid separator and the second evaporator outlet coupled to a second exhaust line.

16. The thermal management system of claim 15, further comprising:
a second flow control device coupled between the liquid-side outlet and the second evaporator inlet.

17. The thermal management system of claim 16, wherein the second flow control device expands the refrigerant liquid from the liquid-side outlet, which is received at the second evaporator inlet.

18. The thermal management system of claim 16, wherein the second flow control device is an expansion valve and the second evaporator operates at a superheat.

19. The thermal management system of claim 18, further comprising:
a sensor disposed at the second evaporator outlet to measure a thermodynamic property of the refrigerant fluid at the second evaporator outlet and to generate a control signal to directly or indirectly control operation of the second flow control device.

20. The thermal management system of claim 19, wherein the signal controls operation of the second flow control device to control superheat at the second evaporator outlet.

21. The thermal management system of claim 15, wherein the refrigerant fluid comprises ammonia.

22. The thermal management system of claim 1, wherein the refrigerant fluid comprises ammonia.

23. The thermal management system of claim 1, wherein the exhaust line comprises an outlet at an ambient environment.

24. A thermal management method, comprising:
pumping a refrigerant liquid from a liquid separator to a first evaporator that is in thermal contact with at least one first heat load to extract heat from the at least one first heat load with the refrigerant liquid;
transporting a mixed-phase refrigerant fluid from the first evaporator through a second evaporator that is in thermal contact with at least one second heat load to extract heat from the at least one second heat load;
separating by operation of the liquid separator, the mixed-phase refrigerant fluid at an outlet of the first evaporator into a refrigerant vapor and the refrigerant liquid;
discharging the refrigerant vapor through a flow control device to an exhaust line so that the discharged refrigerant vapor is not returned to the liquid separator; and
receiving, by a refrigerant processing apparatus coupled to the exhaust line, the discharged refrigerant vapor, the refrigerant processing apparatus comprising at least one of: a chemical scrubber configured to convert the refrigerant vapor into one or more products that are chemically different from the refrigerant vapor; an adsorbent material configured to adsorb particles of the refrigerant vapor; or an incinerator configured to incinerate the refrigerant vapor.

25. The method of claim 24, further comprising:
receiving the refrigerant liquid from the liquid separator at a single pressure; and
transporting the refrigerant liquid into the first evaporator at the single pressure.

26. The method of claim 24 wherein the flow control device is a back-pressure regulator.

27. The method of claim 24 wherein the at least one first heat load comprises one or more diodes of a directed energy system.

28. The method of claim 24 wherein the first evaporator has an inlet coupled to an outlet of the second evaporator, with the first evaporator further having an outlet coupled to the inlet of the liquid separator and the inlet of the second evaporator is coupled to the outlet of the pump, and transporting the mixed-phase refrigerant fluid comprises:
transporting the mixed-phase refrigerant fluid from the outlet of the first evaporator to the inlet of the second evaporator, with the outlet of the second evaporator feeding the mixed-phase refrigerant fluid to the inlet of the liquid separator.

29. The method of claim 24, wherein the first and second evaporators are integrated into a single evaporator that has a first refrigerant path and a second refrigerant path.

30. The method of claim 29, wherein transporting further comprises:
transporting the mixed-phase refrigerant fluid through the first refrigerant path to the inlet of the liquid separator, and from the liquid side outlet through the second refrigerant path back to the inlet of the first refrigerant path.

31. The method of claim 29, wherein the refrigerant liquid comprises ammonia.

32. The method of claim 24, wherein the first evaporator has the inlet coupled to the outlet of the pump and the outlet coupled to inlet of the liquid separator, and with the second evaporator has having the inlet coupled to the outlet of the liquid separator and the outlet coupled to a second exhaust line.

33. The method of claim 32, further comprising:
transporting a portion of the refrigerant liquid from the liquid side outlet through a second flow control device coupled between the liquid-side outlet and the inlet of the second evaporator.

34. The method of claim 33, wherein the second evaporator operates at a superheat, and the method further comprises:
measuring with a sensor disposed at the outlet of the second evaporator, a thermodynamic property of the mixed-phase refrigerant fluid at the outlet of the second evaporator; and
generating, based on the measured thermodynamic property, a control signal to directly or indirectly control operation of the second flow control device.

35. The method of claim 24, wherein the refrigerant liquid comprises ammonia.

* * * * *